(12) United States Patent
Fujiwara et al.

(10) Patent No.: US 12,300,912 B2
(45) Date of Patent: May 13, 2025

(54) FILTER ASSEMBLY OPERATING AT A WIDER PASSBAND WITH IMPROVED REFLECTION COEFFICIENT

(71) Applicant: SKYWORKS SOLUTIONS, INC., Irvine, CA (US)

(72) Inventors: Joji Fujiwara, Suita (JP); Motoyuki Tajima, Yokohama (JP); Rei Goto, Osaka (JP); Yiliu Wang, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 102 days.

(21) Appl. No.: 18/157,202

(22) Filed: Jan. 20, 2023

(65) Prior Publication Data

US 2024/0250435 A1    Jul. 25, 2024

Related U.S. Application Data

(60) Provisional application No. 63/303,701, filed on Jan. 27, 2022.

(51) Int. Cl.
*H01Q 9/04* (2006.01)
*H01Q 9/24* (2006.01)
*H03H 9/64* (2006.01)

(52) U.S. Cl.
CPC ............. *H01Q 9/0485* (2013.01); *H01Q 9/24* (2013.01); *H03H 9/6483* (2013.01)

(58) Field of Classification Search
CPC ...... H03H 9/6483; H03H 9/542; H03H 9/605; H03H 9/205; H03H 9/02007; H03H 7/1758; H03H 9/568; H03H 9/02559; H03H 9/0211; H03H 9/02015; H03H 3/08; H03H 3/02; H03H 9/175; H04J 1/045

See application file for complete search history.

(56) References Cited

U.S. PATENT DOCUMENTS

2020/0014370 A1\* 1/2020 Matsubara ............. H03H 9/568
2021/0119601 A1\* 4/2021 Lu ....................... H03H 9/14511

\* cited by examiner

*Primary Examiner* — Monica C King
(74) *Attorney, Agent, or Firm* — Lando & Anastasi, LLP

(57) ABSTRACT

A filter assembly operating at wider passband with an enhanced reflection coefficient is provided herein. In certain embodiments, the filter assembly comprises a first filter configured to allow signals received via an antenna node to pass at a first passband, the first filter including a plurality of resonators connected in series and parallel arms, the plurality of resonators of the first filter including a first type of resonator configured to broaden the first passband, at least a series resonator nearest to the antenna node or a shunt resonator nearest to the antenna node among the plurality of resonators of the first filter being a second type of resonator configured to improve reflection characteristics at a stopband of the first filter, and a second filter configured to allow the signals received via the antenna node to pass at a second passband using the second type of resonators.

16 Claims, 18 Drawing Sheets

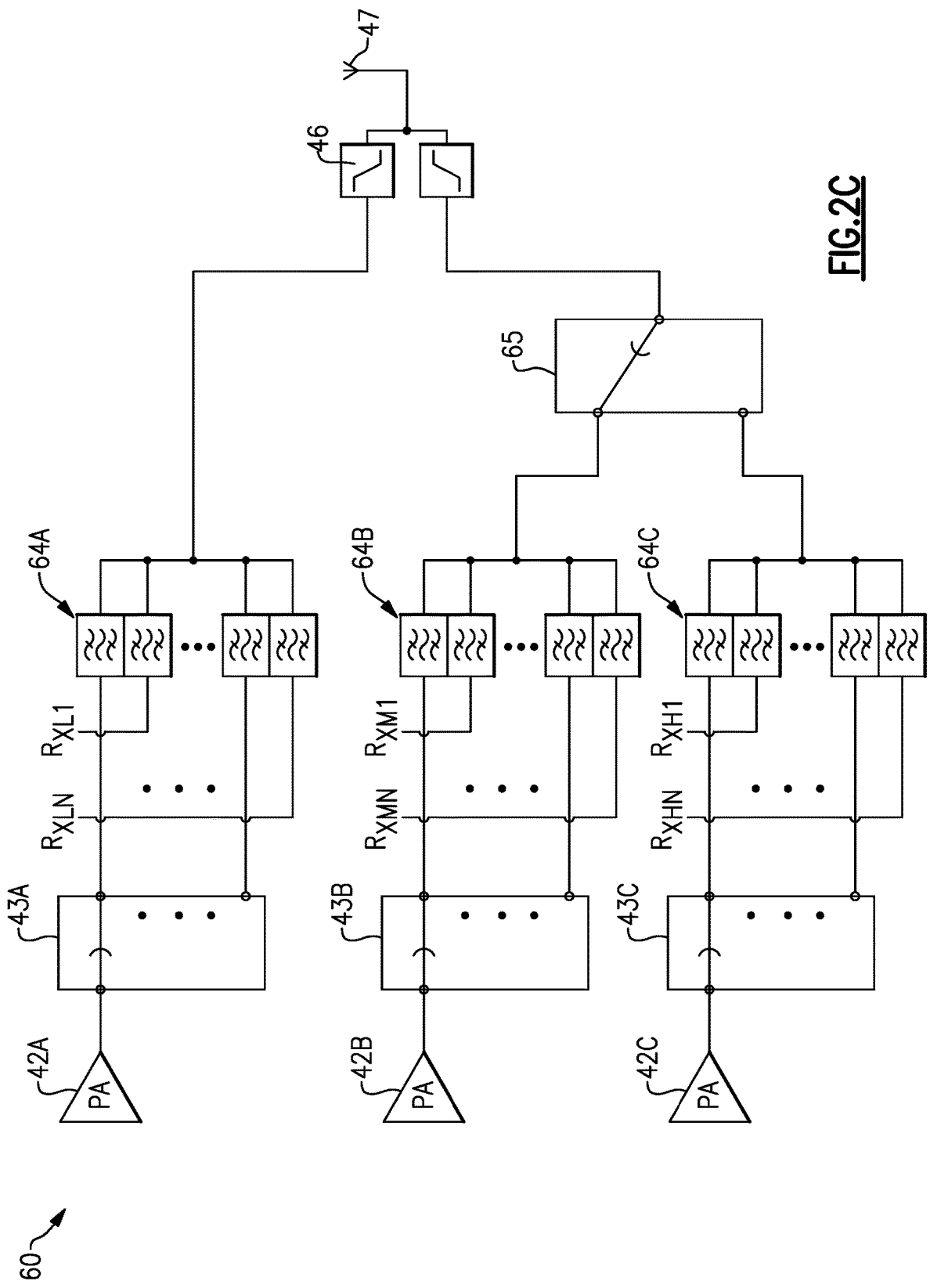

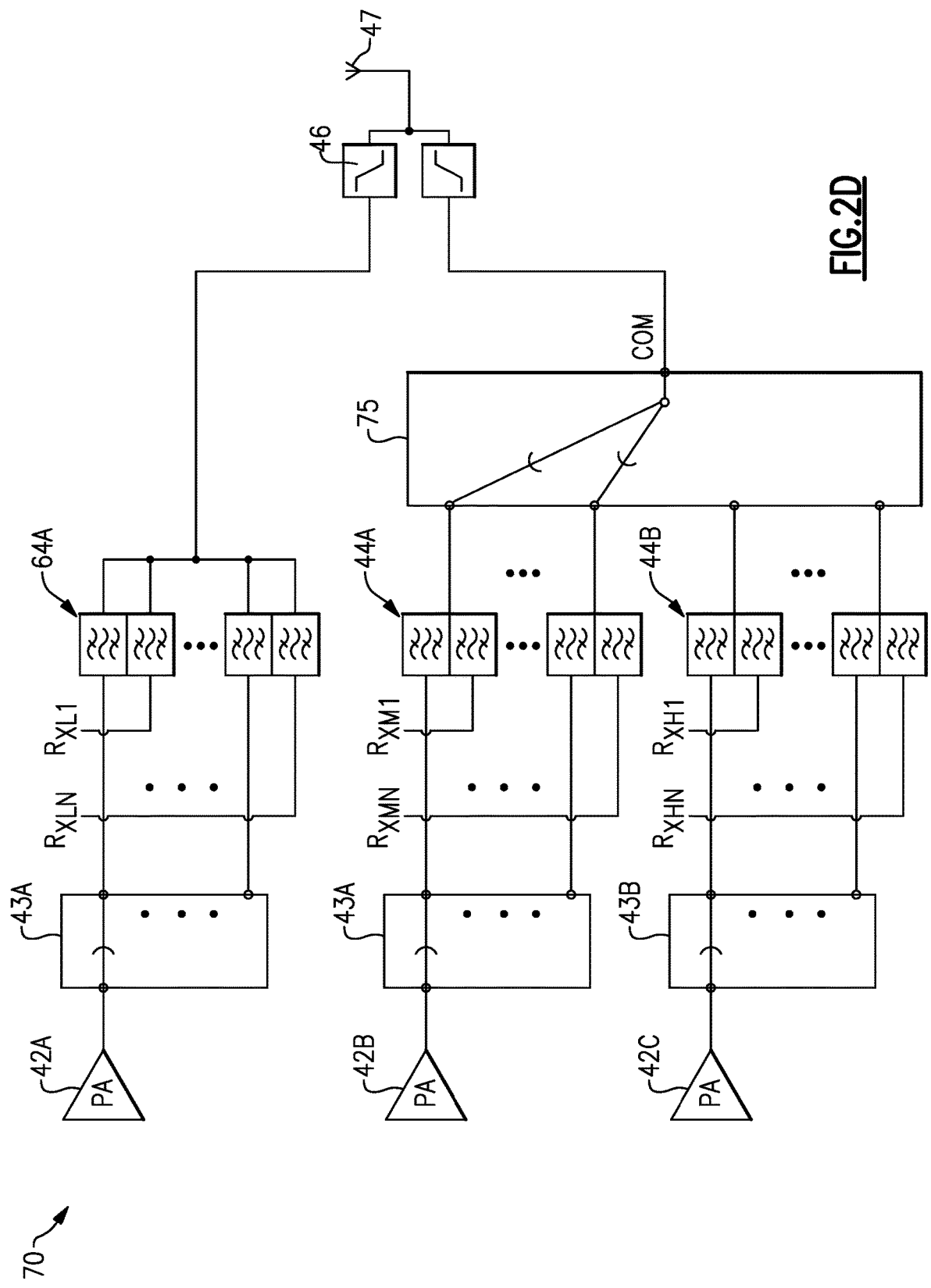

FILTER ASSEMBLY OPERATING AT A WIDER PASSBAND WITH IMPROVED REFLECTION COEFFICIENT

CROSS-REFERENCE TO RELATED APPLICATIONS

This application claims priority under 35 U.S.C. § 1109(e) to U.S. Provisional Patent Application Ser. No. 63/303,701, titled "FILTER ASSEMBLY OPERATING AT A WIDER PASSBAND WITH IMPROVED REFLECTION COEFFICIENT," filed Jan. 27, 2022, the entire content of which is incorporated herein by reference for all purposes.

BACKGROUND

Field

Aspects and embodiments disclosed herein relate to electronic systems, and in particular, to filter assemblies for use in radio frequency (RF) electronics.

Description of the Related Technology

Filters are used in radio frequency (RF) communication systems to allow signals to pass through at discreet frequencies while rejecting frequencies outside of the specified range. An acoustic wave filter, which is used widely in the wireless communication field, can include a plurality of resonators arranged to filter a radio frequency signal. Example acoustic wave filters include surface acoustic wave (SAW) filters and/or bulk acoustic wave (BAW) filters. A film bulk acoustic resonator (FBAR) filter is an example of a BAW filter. Acoustic wave filters can be implemented in radio frequency electronic systems. For instance, filters in a radio frequency front end of a mobile phone can include acoustic wave filters. A plurality of acoustic wave filters can be arranged as a multiplexer. For example, two surface acoustic wave filters can be arranged as a duplexer.

Examples of RF communication systems with one or more filter modules include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for certain communications standards.

SUMMARY

In accordance with one aspect, there is provided a filter assembly. The filter assembly comprises a first filter configured to allow signals received via an antenna node to pass at a first passband, the first filter including a plurality of resonators connected in series and parallel arms, the plurality of resonators of the first filter including a first type of resonator configured to broaden the first passband, at least a series resonator nearest to the antenna node or a shunt resonator nearest to the antenna node among the plurality of resonators of the first filter being a second type of resonator configured to improve reflection characteristics at a stopband of the first filter, and a second filter configured to allow the signals received via the antenna node to pass at a second passband using the second type of resonators.

In some embodiments, the first passband has lower frequency range than the second passband.

In some embodiments, each of the first filter and the second filter is a ladder-type surface acoustic wave filter.

In some embodiments, the first type of resonators are formed on a first substrate having a different cut angle from a second substrate on which the second type of resonators are formed.

In some embodiments, each of the first substrate and the second substrate is a piezoelectric substrate formed of lithium niobate ($LiNbO_3$).

In some embodiments, the first substrate has a range of $80°<\theta<120°$ in Euler angle ($\phi$, $\theta$, $\psi$) notation, and the second substrate has a range of $26°<\theta<46°$ in Euler angle ($\phi$, $\theta$, $\psi$) notation, $\phi$ and $\theta$ being cut angles of each of the first substrate and the second substrate, and $\psi$ being a propagation angle of each of the first substrate and the second substrate.

In some embodiments, the first substrate and the second substrate have same ranges of $\phi$ and $\psi$ in the Euler angle ($\phi$, $\theta$, $\psi$) notation.

In some embodiments, the first type of resonators are resonators configured to detect one of a shear horizontal (SH) wave propagation or a Rayleigh wave propagation.

In some embodiments, the second type of resonators of the first filter are formed on the second substrate together with the second type of resonators of the second filter in a single die.

In some embodiments, wherein the filter assembly includes a multiplexer that includes the first filter and the second filter.

In accordance with another aspect, there is provided a radio frequency module. The radio frequency module comprises a packaging board configured to receive a plurality of components, a filter assembly implemented on the packaging board, the filter assembly including a first filter configured to allow signals received through an antenna node to pass at a first passband, the first filter including a plurality of resonators connected in series and parallel arms, the plurality of resonators of the first filter including a first type of resonator that are formed on a first substrate to broaden the first passband, at least a series resonator nearest to the antenna node or a shunt resonator nearest to the antenna node among the plurality of resonators of the first filter being a second type of resonator that is formed on a second substrate to improve reflection characteristics at a stopband of the first filter, and a second filter configured to allow the signals received via the antenna node to pass at a second passband using the second type of resonators.

In some embodiments, the radio frequency module is a front-end module.

In some embodiments, the first passband has a lower frequency range than the second passband.

In some embodiments, each of the first filter and the second filter is a ladder-type surface acoustic wave filter.

In some embodiments, the first substrate has a different cut angle from the second substrate.

In some embodiments, each of the first substrate and the second substrate is a piezoelectric substrate formed of lithium niobate ($LiNbO_3$).

In some embodiments, the first substrate has a range of $80°<\theta<120°$ in Euler angle notation, and the second substrate has a range of $26°<\theta<46°$ in Euler angle ($\phi$, $\theta$, $\psi$) notation, $\phi$ and $\theta$ being cut angles of each of the first substrate and the second substrate, and ψ being a propagation angle of each of the first substrate and the second substrate.

In some embodiments, the first substrate and the second substrate have same ranges of φ and ψ from the Euler angle (φ, θ, ψ) notation.

In some embodiments, the first type of resonators are resonators configured to detect one of a shear horizontal (SH) wave propagation or a Rayleigh wave propagation.

In some embodiments, the second type of resonators of the first filter are formed on the second substrate together with the second type of resonators of the second filter in a single die.

In some embodiments, the filter assembly includes a multiplexer that includes the first filter and the second filter.

In accordance with another aspect, there is provided a mobile device. The mobile device comprises an antenna configured to receive a radio frequency signal, and a front end system configured to communicate with the antenna, the front end system including a filter assembly having a first filter configured to allow signals received through an antenna node to pass at a first passband, the first filter including a plurality of resonators connected in series and parallel arms, the plurality of resonators of the first filter including a first type of resonator that are formed on a first substrate to broaden the first passband, at least a series resonator nearest to the antenna node or a shunt resonator nearest to the antenna node among the plurality of resonators of the first filter being a second type of resonator that are formed on a second substrate such to improve reflection characteristics at a stopband of the first filter, and a second filter configured to allow the signals received via the antenna node to pass at a second passband using the second type of resonators.

In some embodiments, the first passband has a lower frequency range than the second passband.

In some embodiments, each of the first filter and the second filter is a ladder-type surface acoustic wave filter.

In some embodiments, the first substrate has a different cut angle from the second substrate.

In some embodiments, each of the first substrate and the second substrate is a piezoelectric substrate formed of lithium niobate ($LiNbO_3$).

In some embodiments, the first substrate has a range of 80°<θ<120° in Euler angle notation, and the second substrate has a range of 26°<θ<46° in Euler angle (φ, θ, ψ) notation, φ and θ being cut angles of each of the first substrate and the second substrate, and ψ being a propagation angle of each of the first substrate and the second substrate.

In some embodiments, the first substrate and the second substrate have same ranges of φ and ψ from the Euler angle (φ, θ, ψ) notation.

In some embodiments, the first type of resonators are resonators configured to detect one of a shear horizontal (SH) wave propagation or a Rayleigh wave propagation.

In some embodiments, the second type of resonators of the first filter are formed on the second substrate together with the second type of resonators of the second filter in a single die.

In some embodiments, the filter assembly includes a multiplexer that includes the first filter and the second filter.

BRIEF DESCRIPTION OF THE DRAWINGS

FIG. 2C is a schematic diagram of a carrier aggregation system;

FIG. 2D is a schematic diagram of a carrier aggregation system;

DETAILED DESCRIPTION OF EMBODIMENTS

Figure 1:
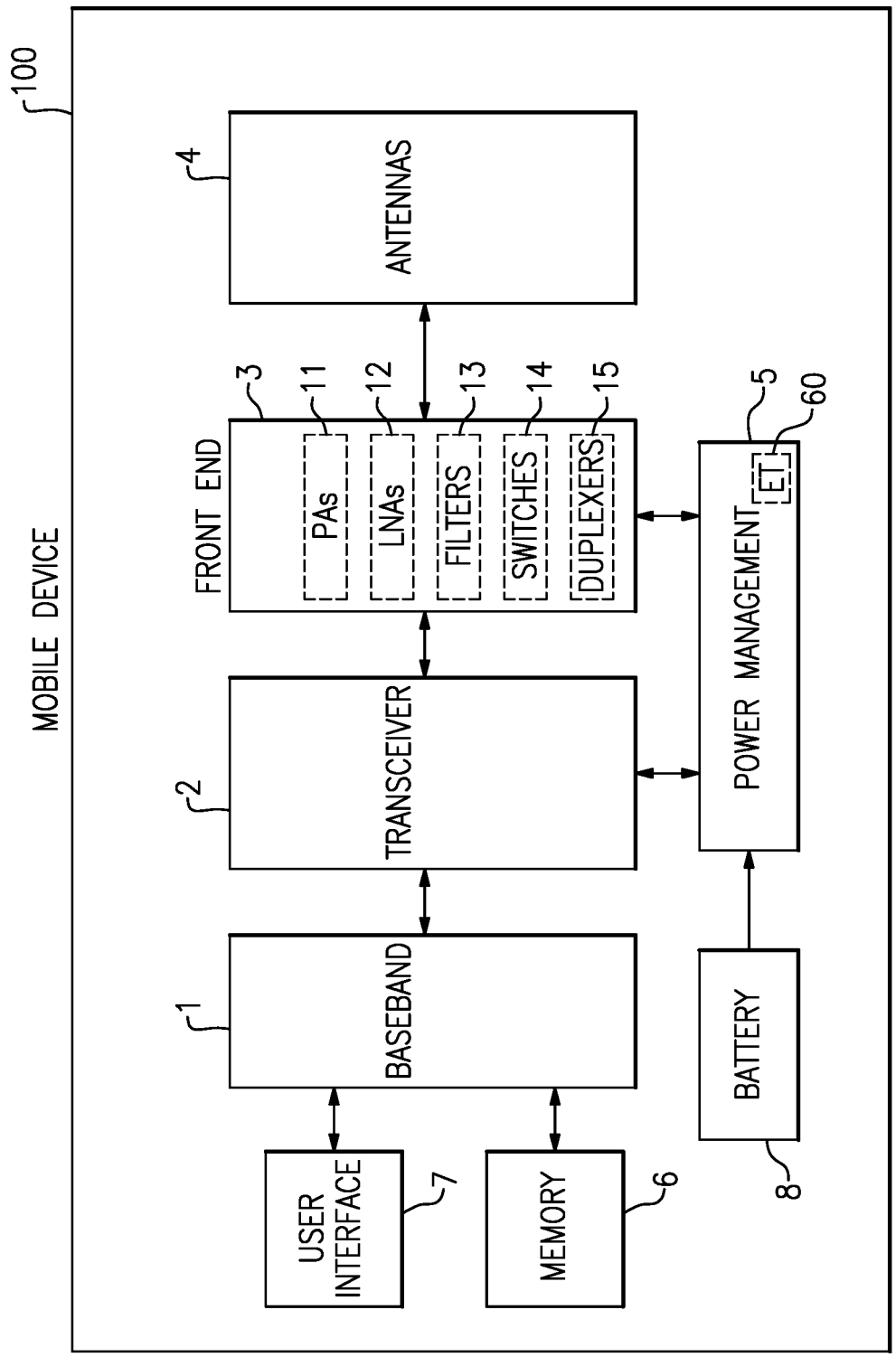
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a mobile device 100. The mobile device 100 includes a baseband system 1, a transceiver 2, a front end system 3, antennas 4, a power management system 5, a memory 6, a user interface 7, and a battery 8.

The mobile device 100 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 2 generates RF signals for transmission and processes incoming RF signals received from the antennas 4. It will be understood that various functionalities associated with the transmission and receiving of RF signals can be achieved by one or more components that are collectively represented in FIG. 1 as the transceiver 2. In one example, separate components (for instance, separate circuits or dies) can be provided for handling certain types of RF signals.

The front end system 3 aids in conditioning signals transmitted to and/or received from the antennas 4. In the illustrated embodiment, the front end system 3 includes power amplifiers (PAS) 11, low noise amplifiers (LNAs) 12, filters 13, switches 14, and duplexers 15. However, other implementations are possible.

For example, the front end system 3 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 4 can include antennas used for a wide variety of types of communications. For example, the antennas 4 can include antennas associated transmitting and/or receiving signals associated with a wide variety of frequencies and communications standards.

In certain implementations, the antennas 4 support Multiple Input Multiple Output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 100 can operate with beamforming in certain implementations. For example, the front end system 3 can include phase shifters having variable phase controlled by the transceiver 2. Additionally, the phase shifters are controlled to provide beam formation and directivity for transmission and/or reception of signals using the antennas 4. For example, in the context of signal transmission, the phases of the transmit signals provided to the antennas 4 are controlled such that radiated signals from the antennas 4 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 4 from a particular direction. In certain implementations, the antennas 4 include one or more arrays of antenna elements to enhance beamforming.

The baseband system 1 is coupled to the user interface 7 to facilitate processing of various user input and output (I/O), such as voice and data. The baseband system 1 provides the transceiver 2 with digital representations of transmit signals, which the transceiver 2 processes to generate RF signals for transmission. The baseband system 1 also processes digital representations of received signals provided by the transceiver 2. As shown in FIG. 1, the baseband system 1 is coupled to the memory 6 to facilitate operation of the mobile device 100.

The memory 6 can be used for a wide variety of purposes, such as storing data and/or instructions to facilitate the operation of the mobile device 100 and/or to provide storage of user information.

The power management system 5 provides a number of power management functions of the mobile device 100. The power management system 5 of FIG. 1 includes an envelope tracker 60. As shown in FIG. 1, the power management system 5 receives a battery voltage form the battery 8. The battery 8 can be any suitable battery for use in the mobile device 100, including, for example, a lithium-ion battery.

The mobile device 100 of FIG. 1 illustrates one example of an RF communication system that can include power amplifier(s) implemented in accordance with one or more features of the present disclosure. However, the teachings herein are applicable to RF communication systems implemented in a wide variety of ways.

Figure 2A:
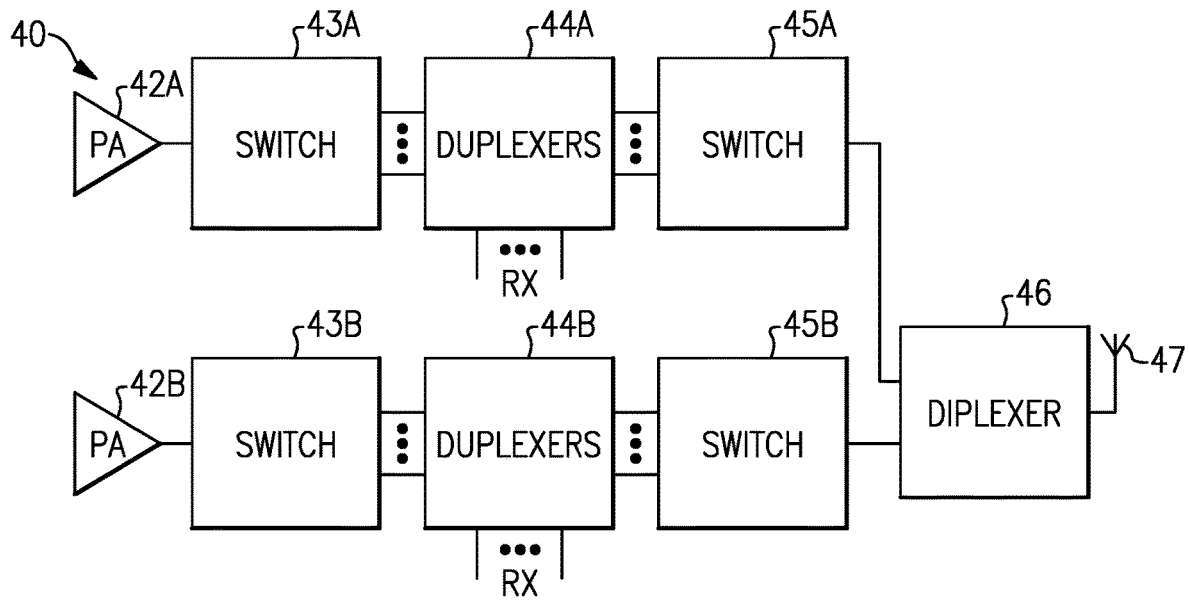
FIG. 2A is a schematic diagram of a carrier aggregation system.

FIG. 2A is a schematic diagram of a carrier aggregation system 40. The illustrated carrier aggregation system 40 includes power amplifiers 42A and 42B, switches 43A and 43B, duplexers 44A and 44B, switches 45A and 45B, diplexer 46, and antenna 47. The power amplifiers 42A and 42B can each transmit an amplified RF signal associated with a different carrier. The switch 43A can be a band select switch. The switch 43A can couple an output of the power amplifier 42A to a selected duplexer of the duplexers 44A, 44B. Each of the duplexers can include a transmit filter and receive filter. Any of the filters of the duplexers 44A and 44B can be implemented in accordance with any suitable principles and advantages discussed herein. The switches 45A, 45B can couple the selected duplexer of the duplexers 44A, 44B to the diplexer 46. The diplexer 46 can combine RF signals provided by the switches 45A and 45B into a carrier aggregation signal that is transmitted by the antenna 47. The diplexer 46 can isolate different frequency bands of a carrier aggregation signal received by the antenna 47. The diplexer 46 is an example of a frequency domain multiplexer. Other frequency domain multiplexers include a triplexer. Carrier aggregation systems that include triplexers can process carrier aggregation signals associated with three carriers. The switches 45A and 45B and selected receive filters of the duplexers 44A and 44B can provide RF signals with the isolated frequency bands to respective receive paths.

Figure 2B:
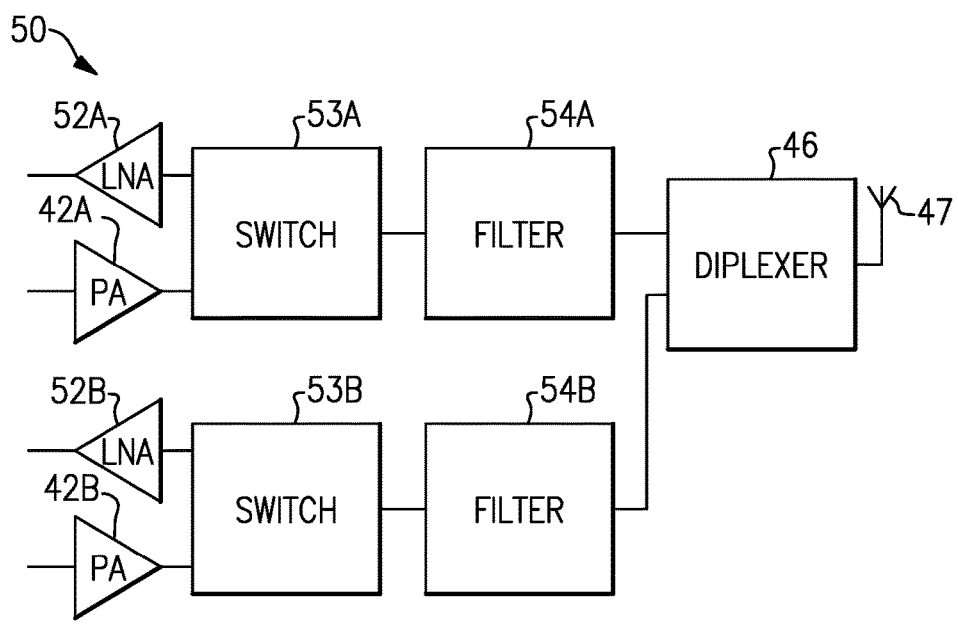
FIG. 2B is a schematic diagram of a carrier aggregation system.

FIG. 2B is a schematic diagram of a carrier aggregation system 50. The illustrated carrier aggregation system 50 includes power amplifiers 42A and 42B, low noise amplifiers 52A and 52B, switches 53A and 53B, filters 54A and 54B, diplexer 46, and antenna 47. The power amplifiers 42A and 42B can each transmit an amplified RF signal associated with a different carrier. The switches 53A, 53B can be transmit/receive switches. The switch 53A can couple the filter 54A to an output of the power amplifier 42A in a transmit mode and to an input of the low noise amplifier 52A in a receive mode. The filter 54A and/or the filter 54B can be implemented in accordance with any suitable principles and advantages discussed herein. The diplexer 46 can combine RF signals from the power amplifiers 42A and 42B provided by the switches 53A and 53B into a carrier aggregation signal that is transmitted by the antenna 47. The diplexer 46 can isolate different frequency bands of a carrier aggregation signal received by the antenna 47. The switches 53A and 53B and the filters 54A and 54B can provide RF signals with the isolated frequency bands to respective low noise amplifiers 52A and 52B.

FIG. 2C is a schematic diagram of a carrier aggregation system 60 that includes multiplexers in signal paths between power amplifiers and an antenna. The illustrated carrier aggregation system 60 includes a low band path, a medium band path, and a high band path. In certain applications, a low band path can process radio frequency signals having a frequency of less than 1 GHZ, a medium band path can process radio frequency signals having a frequency between 1 GHz and 2.2 GHz, and a high band path can process radio frequency signals having a frequency above 2.2 GHZ.

A diplexer 46 can be included between RF signal paths and an antenna 47. The diplexer 46 can frequency multiplex radio frequency signals that are relatively far away in frequency. The diplexer 46 can be implemented with passive circuit elements having a relatively low loss. The diplexer 46 can combine (for transmit) and separate (for receive) carriers of carrier aggregation signals.

As illustrated, the low band path includes a power amplifier 42A configured to amplify a low band radio frequency signal, a band select switch 43A, and a multiplexer 64A. The band select switch 43A can electrically connect the output of the power amplifier 42A to a selected transmit filter of the multiplexer 64A. The selected transmit filter can be a band pass filter with pass band corresponding to a frequency of an output signal of the power amplifier 42A. The multiplexer 64A can include any suitable number of transmit filters and any suitable number of receive filters. One or more of the transmit filters and/or one or more of the receive filters can be implemented in accordance with any suitable principles and advantages discussed herein. The multiplexer 64A can have the same number of transmit filters as receive filters. In some instances, the multiplexer 64A can have different numbers of transmit filters and As illustrated in FIG. 2C, the medium band path includes a power amplifier 42B configured to amplify a medium band radio frequency signal, a band select switch 43B, and a multiplexer 64B. The band select switch 43B can electrically connect the output of the power amplifier 42B to a selected transmit filter of the multiplexer 64B. The selected transmit filter can be a band pass filter with pass band corresponding to a frequency of an output signal of the power amplifier 42B. The multiplexer 64B can include any suitable number of transmit filters and any suitable number of receive filters. One or more of the transmit filters and/or one or more of the receive filters can be implemented in accordance with any suitable principles and advantages discussed herein. The multiplexer 64B can have the same number of transmit filters as receive filters. In some instances, the multiplexer 64B can have different numbers of transmit filters and receive filters, respectively.

In the illustrated carrier aggregation system 60, the high band path includes a power amplifier 42C configured to amplify a high band radio frequency signal, a band select switch 43C, and a multiplexer 64C. The band select switch 43C can electrically connect the output of the power amplifier 42C to a selected transmit filter of the multiplexer 64C. The selected transmit filter can be a band pass filter with pass band corresponding to a frequency of an output signal of the power amplifier 42C. The multiplexer 64C can include any suitable number of transmit filters and any suitable number of receive filters. One or more of the transmit filters and/or one or more of the receive filters can be implemented in accordance with any suitable principles and advantages discussed herein. The multiplexer 64C can have the same number of transmit filters as receive filters. In some instances, the multiplexer 64C can have different numbers of transmit filters and receive filters, respectively.

A select switch 65 can selectively provide a radio frequency signal from the medium band path or the high band path to the diplexer 46. Accordingly, the carrier aggregation system 60 can process carrier aggregation signals with either a low band and high band combination or a low band and medium band combination.

FIG. 2D is a schematic diagram of a carrier aggregation system 70 that includes multiplexers in signal paths between power amplifiers and an antenna. The carrier aggregation system 70 is like the carrier aggregation system 60 of FIG. 2C, except that the carrier aggregation system 70 includes switch-plexing features. Switch-plexing can be implemented in accordance with any suitable principles and advantages discussed herein.

Switch-plexing can implement on-demand multiplexing. Some radio frequency systems can operate in a single carrier mode for a majority of time (e.g., about 95% of the time) and in a carrier aggregation mode for a minority of the time (e.g., about 5% of the time). Switch-plexing can reduce loading in a single carrier mode in which the radio frequency system can operate for the majority of the time relative to a multiplexer that includes filters having a fixed connection at a common node. Such a reduction in loading can be more significant when there is a relatively larger number of filters included in a multiplexer.

In the illustrated carrier aggregation system 70, duplexers 44A and 44B are selectively coupled to a diplexer 46 by way of a switch 75. The switch 75 is configured as a multi-close switch that can have two or more throws active concurrently. Having multiple throws of the switch 75 active concurrently can enable transmission and/or reception of carrier aggregation signals. The switch 75 can also have a single throw active during a single carrier mode. As illustrated, each duplexer of the duplexers 44A is coupled to separate throws of the switch 75. Similarly, the illustrated duplexers 44B include a plurality of duplexers coupled to separate throws of the switch 75. Alternatively, instead of duplexers being coupled to each throw of the switch 75 as illustrated in FIG. 2D, one or more individual filters of a multiplexer can be coupled to a dedicated throw of a switch coupled between the multiplexer and a common node. For instance, in some implementations, such a switch could have twice as many throws as the illustrated switch 75.

Figure 3A:
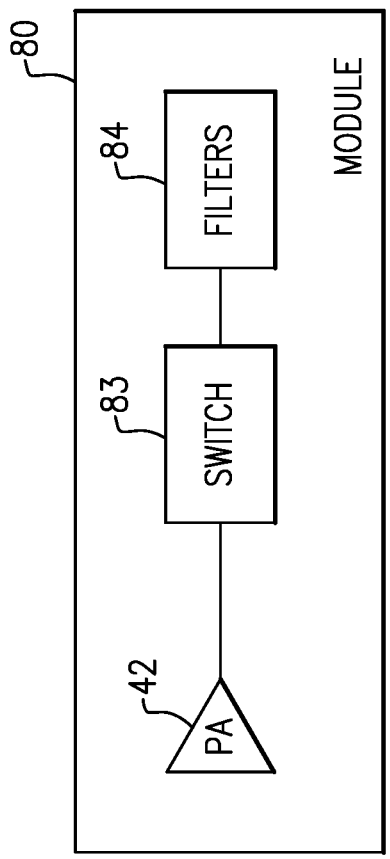
FIG. 3A is a schematic block diagram of a module that includes a filter.
Figure 3B:
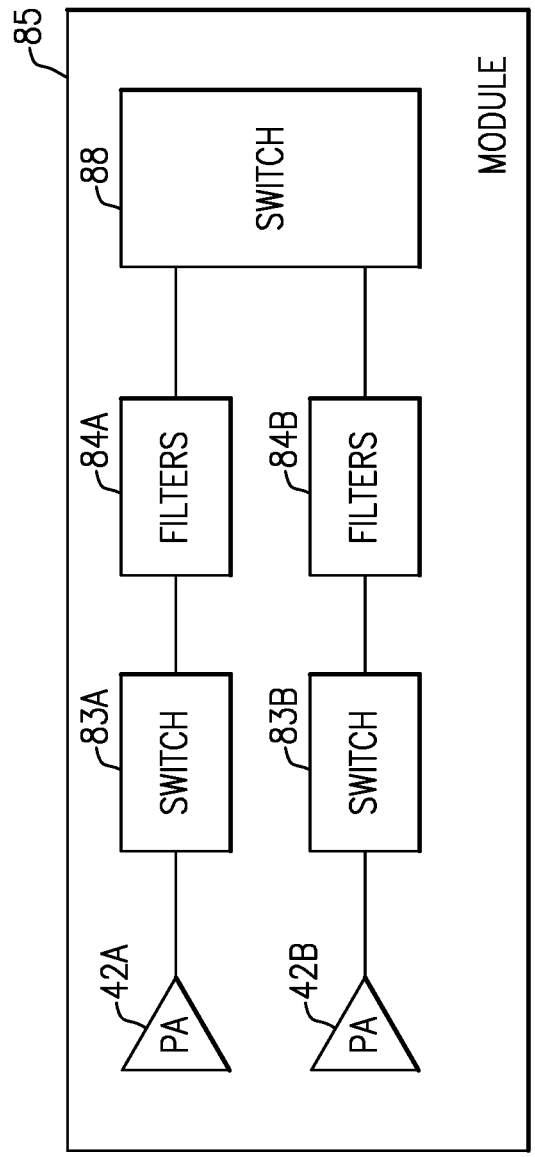
FIG. 3B is a schematic block diagram of a module that includes a filter.

The filters discussed herein can be implemented in a variety of packaged modules. Some example packaged modules will now be discussed in which any suitable principles and advantages of the filters discussed herein can be implemented. FIGS. 3A and 3B are schematic block diagrams of illustrative packaged modules according to certain embodiments.

FIG. 3A is a schematic block diagram of a module 80 that includes a power amplifier 42, a switch 83, and filters 84 in accordance with one or more embodiments. The module 80 can include a package that encloses the illustrated elements. The power amplifier 42, a switch 83, and filters 84 can be disposed on a common packaging substrate. The packaging substrate can be a laminate substrate, for example. The switch 83 can be a multi-throw radio frequency switch. The switch 83 can electrically couple an output of the power amplifier 42 to a selected filter of the filters 84. The filters 84 can include any suitable number of surface acoustic wave filters. One or more filters of the filters 84 can be implemented in accordance with any suitable principles and advantages disclosed herein.

FIG. 3B is a schematic block diagram of a module 85 that includes power amplifiers 42A and 42B, switches 83A and 83B, and filters 84A and 84B in accordance with one or more embodiments, and an antenna switch 88. The module 85 is like the module 80 of FIG. 3A, except the module 85 includes an additional RF signal path and the antenna switch 88 arranged to selectively couple a signal from the filters 84A or the filters 84B to an antenna node. One or more filters of the filters 84A and/or 84B can be implemented in accordance with any suitable principles and advantages disclosed herein. The additional RF signal path includes an additional power amplifier 42B, an additional switch 83B, and additional filters 84B. The different RF signal paths can be associated with different frequency bands and/or different modes of operation (e.g., different power modes, different signaling modes, etc.).

Radio-frequency (RF) filters, for example, based on SAW resonators on piezoelectric materials, such as LiNbO$_3$ or LiTaO$_3$, have been widely used in mobile communications owing to their excellent characteristics, including small size and low insertion loos. A ladder filter may include two SAW resonators connected in series and parallel arms, and is designed such that the anti-resonance frequency ($f_a$) of the parallel arm resonator and the resonance frequency ($f_r$) of the series arm resonator nearly coincide, while notches are located at $f_r$ of the parallel resonator and $f_a$ of the series resonator.

The substrate on which the SAW resonators are formed may have a cut angle defined by Euler angle ($\phi$, $\theta$, $\psi$) notation. From the Euler notation, $\phi$ and $\theta$ are cut angles of the substrate, and $\psi$ is a propagation angle of the substrate.

Figure 4B:
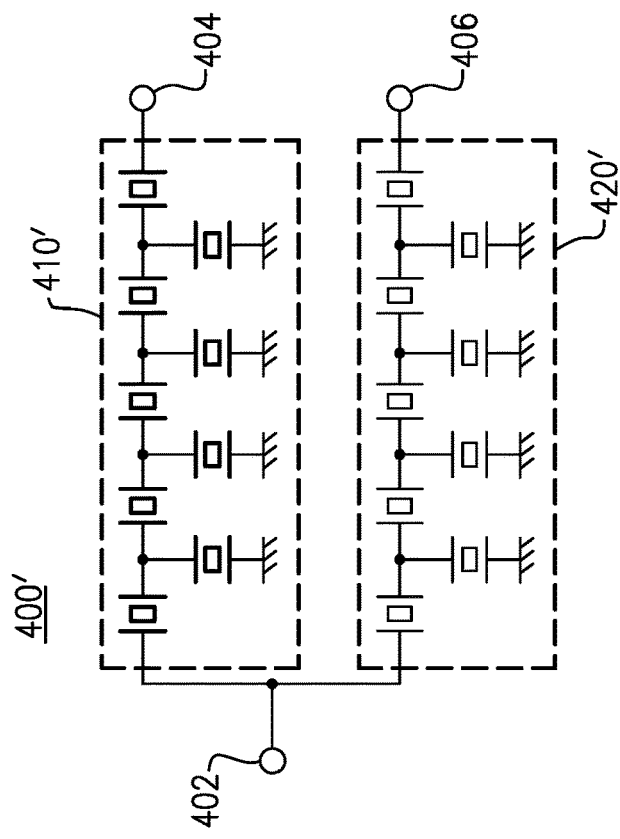
FIG. 4B is another example of schematic diagram of duplexer to enhance bandwidth of the duplexer.
Figure 4A:
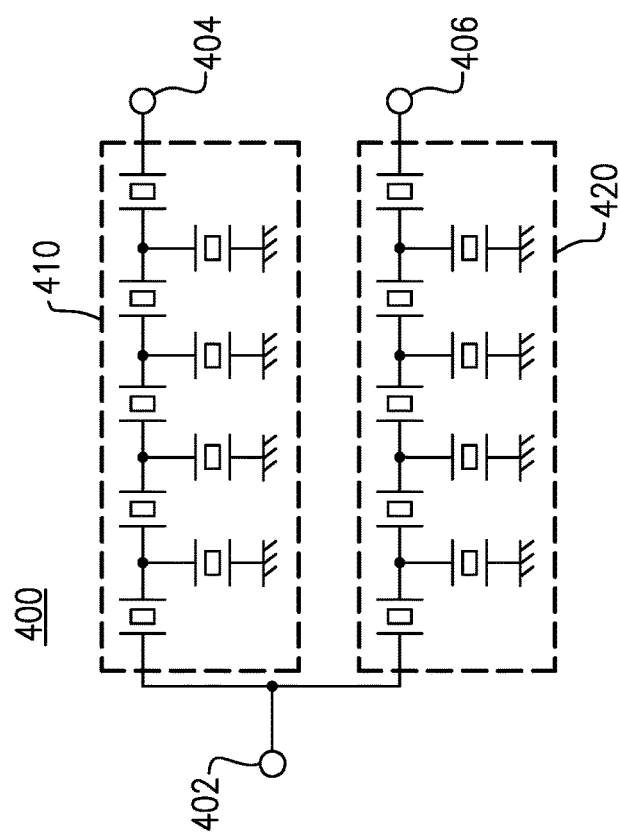
FIG. 4A is an example of schematic diagram of duplexer.
Figure 5:
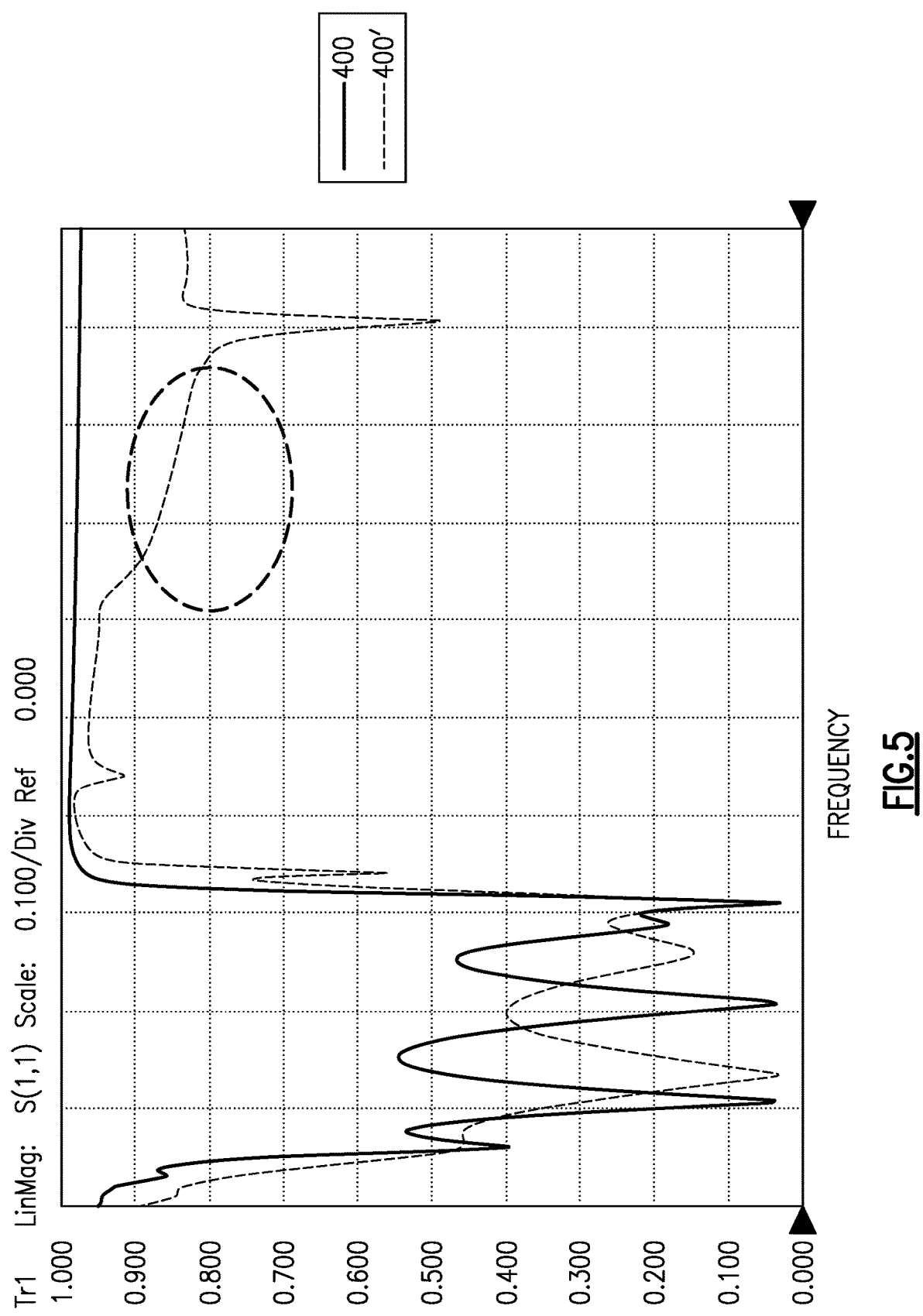
FIG. 5 is an example of graph that shows a measured reflection coefficient of first filter from duplexers illustrated in FIGS. 4A and 4B.

FIGS. 4A and 4B are examples of schematic diagrams of duplexers. FIG. 5 is a graph that shows a measured reflection coefficient of the first filter from the duplexers illustrated in FIGS. 4A and 4B.

FIG. 4A is an example of schematic diagram of a duplexer 400. The duplexer 400 includes a first filter 410 and a second filter 420 which are connected to each other at an antenna node 402. The antenna node 402 may be a node directly or indirectly connected to an antenna. Each of the first filter 410 and the second filter 420 is a ladder-type surface acoustic filter. The radio frequency signal that is input to the first filter 410 or second filter 420 is output through the output nodes 404, 406 of the duplexer 400, respectively.

The first filter 410 and the second filter 420 of the duplexer 400 include a plurality of same type of resonators. Each resonator used for the first filter 410 and the second filter 420 illustrated in FIG. 4A is formed on a substrate having a range of $-10°<\phi 10°$, $26°<\theta<46°$, $-10°<\psi 10°$ in Euler angle ($\phi$, $\theta$, $\psi$) notation, wherein $\phi$ and $\theta$ are cut angles of the substrate, and $\psi$ is a propagation angle of the substrate.

The first filter 410 has a lower frequency passband and the second filter 420 has a higher frequency passband.

In FIG. 5, a reflection coefficient (line 400) of the first filter 410 is drawn. The first filter 410 from duplexer 400 shows fine reflection characteristics at the stopband of the first filter 410, because the reflection coefficient is close to 1.

However, in case of demand for broader passband (e.g., higher K$^2$ value) of the first filter 410, the first filter 410 can be modified. The value of K$^2$ is a measure of the electro-acoustic energy conversion efficiency of a resonator, and can be estimated using the following Formula 1 derived from equivalent circuit analysis:

$$K^2 = (\pi f_r/2f_a)/\tan(\pi f_r/2f_a) \qquad \text{[Formula 1]}$$

Therefore, a large K$^2$ indicates a large difference between $f_r$ and $f_a$, which is of great importance for achieving wideband SAW filters.

FIG. 4B is another example of schematic diagram of a duplexer 400' to enhance bandwidth of the duplexer 400'. The duplexer 410' includes an adjusted first filter 410'. The adjusted first filter 410' is configured to include another type of resonator. The resonators of the adjusted filter 410' are formed on a substrate having a range of $-10°<\phi<10°$, $80°<\theta<120°$, $-10°<\psi<10°$ in Euler angle ($\phi$, $\theta$, $\psi$) notation, wherein $\phi$ and $\theta$ are cut angles of the substrate, and $\psi$ is a propagation angle of the substrate. By replacing the resonator type of the first filter 410 a broader bandwidth of passband can be achieved. Hereinafter, the resonators of the adjusted first filter 410' may be referred to as 'a first type of resonator', and the substrate on which the first type of resonator is formed may be referred to as 'lowcut LN.' The lowcut LN has high K$^2$ value, and therefore the first type of resonator contributes to achieve wider bandwidth of passband of the first filter.

The second filter 420' of the duplexer 400' illustrated in FIG. 4B is identical to the second filter 420 of the duplexer illustrated in FIG. 4A. Hereinafter, the resonators of the second filter 420' illustrated in FIG. 4B may be referred to as 'a second type of resonator', and the substrate on which the second type of resonator is formed may be referred to as '12× LN.'

However, as shown in FIG. 5, it is obvious that the reflection characteristics (line 400') of the adjusted first filter 410' at the stopband is not desirable, because the reflection coefficient is far away from the value 1. This is because the substrate of the first type of resonator, e.g., lowcut LN, generates bulk radiation loss, and therefore there occurs heavy loading loss in the first type of resonators. The lowcut LN resonators which are implemented on the lowcut LN are configured to detect a shear horizontal wave propagation or a Rayleigh wave propagation.

Hereinafter, a filter assembly operating at wider passband with improved reflection coefficient according to an embodiment of the present disclosure is provided.

Figure 6:
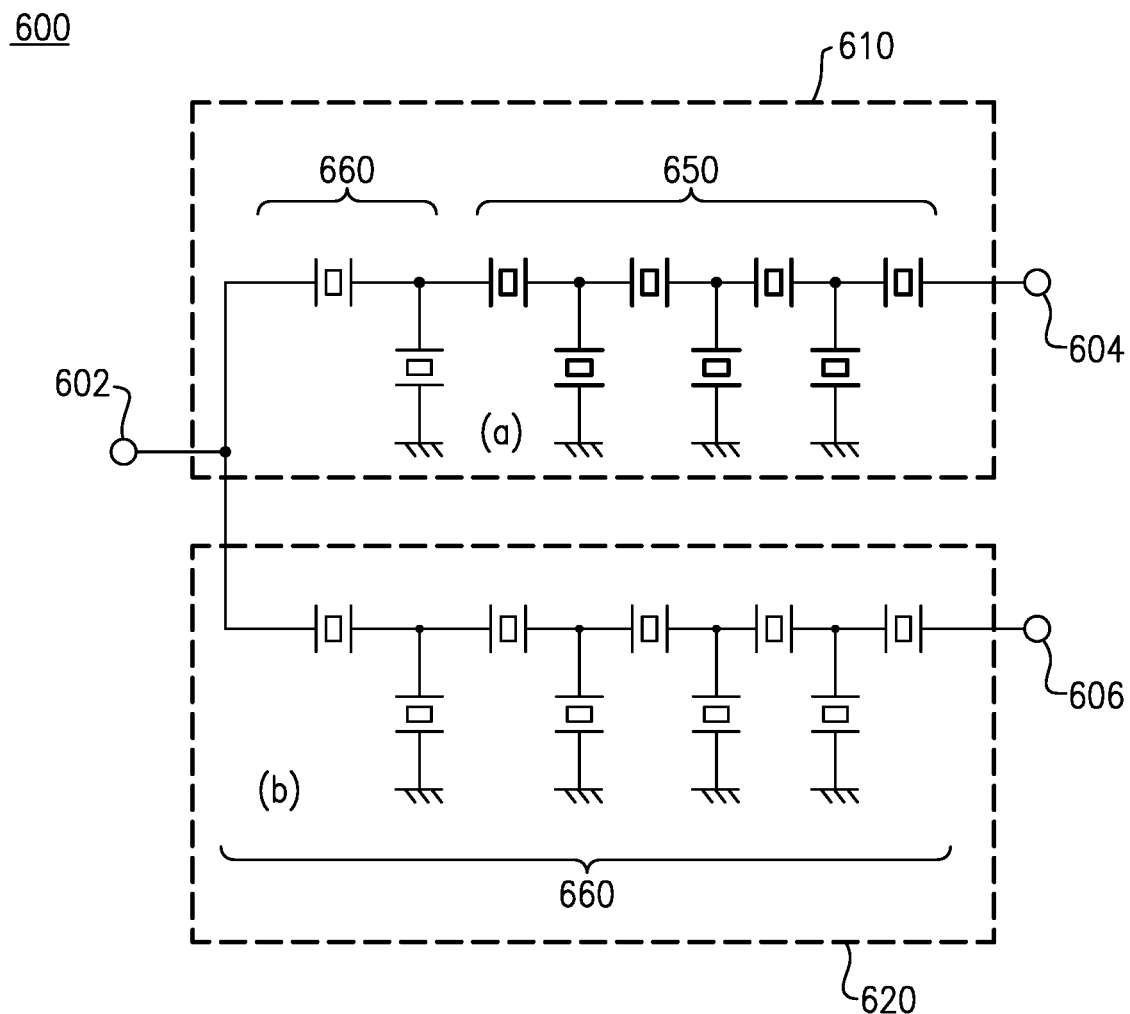
FIG. 6 is an example of structure of a filter assembly according to an embodiment.

FIG. 6 is an example of structure of a filter assembly 600 according to an embodiment. As shown in FIG. 6, the filter assembly 600 according to an embodiment includes a first filter 610 and a second filter 620. The radio frequency signal that is input to the first filter 610 or second filter 620 through an antenna node 602 is output through the output nodes 604, 606, respectively.

The first filter 610 is configured to allow radio frequency signals at a first passband, and the second filter 620 is configured to allow the radio frequency signals at a second passband. The first passband has a lower operating frequency range than the second passband. That is, the first filter 610 is configured to operate at lower frequency range than the second filter 620.

Each of the first filter 610 and the second filter 620 is a ladder-type surface acoustic wave filter. The first filter 610 and the second filter 620 include a plurality of resonators connected in series and parallel arms, respectively. Each of the first filter 610 and the second filter 620 includes a plurality of series resonators and a plurality of shunt resonators disposed between the series resonators and a ground.

The first filter 610 includes a first type of resonators 650. The first type of resonators 650 are configured to broaden the bandwidth of the first passband. As will be described later, the first filter 610 also includes the second type of resonators 660. The first type of resonators 650 and the second type of resonators 660 can be distinguished from each other in type of a substrate on which the first type or second type resonators are formed. The first type of resonators 650 are formed on a first substrate having a different cut angle from a second substrate on which the second type of resonators 660 are formed.

More specifically, the first substrate has a range of $80°<\theta<120°$ in Euler angle $(\phi, \theta, \psi)$ notation, and the second substrate has a range of $26°<\theta<46°$ in Euler angle $(\phi, \theta, \psi)$ notation, wherein $\phi$ and $\theta$ are cut angles of each of the first substrate and the second substrate, and $\psi$ is a propagation angle of each of the first substrate and the second substrate. The first substrate and the second substrate have same ranges of $\phi$ and $\psi$ in the Euler angle $(\phi, \theta, \psi)$ notation. The first substrate may have a shear horizontal (SH) mode as a main response, and the second substrate has a Rayleigh mode as a main response.

The first filter 610 includes the second type of resonators 660 as well. Thus, the first filter 610 is made in a form of combination of different type of resonators. More specifically, the first filter 610 includes the second type of resonators 660 on the side of antenna node 602 to enhance reflection characteristics at a stopband of the first filter 610. Since the resonators on the side of antenna node 602 dominantly influence the reflection coefficient of the filter, it is desired to arrange the second type of resonators 660 on the side of antenna node 602.

According to an embodiment, at least a series resonator nearest to the antenna node 602 or a shunt resonator nearest to the antenna node 602 among the plurality of resonators of the first filter 610 is the second type of resonator 660. According to an example, the series resonator of the first filter 610 nearest to the antenna node 602 may be the second type of resonator 660. Alternatively, the shunt resonator of the first filter nearest to the antenna node 602 may be the second type of resonator 660. According to another example, both the series resonator and the shunt resonator of the first filter 610 nearest to the antenna node 602 may be the second type of resonator 660. According to another example, two series resonators nearest to the antenna node 602 and the shunt resonator nearest to the antenna node 602 may be the second type of resonator 660.

The second filter 620 includes the second type of resonators 660. More specifically, the second filter 620 consists of the second type of resonators 660 and does not include first type of resonators 650. The electrical characteristics of the second filter 620 is influenced by the first filter 610, for example, reflection coefficient, because the first filter 610 and the second filter 620 share a common node, e.g., antenna node 602. By adjusting the construction of the first filter 610, the second filter 620 can also be improved with respect to reflection characteristics.

According to an embodiment, the first type of resonators 650 and the second type of resonators 660 may be fabricated on separate dies (a) and (b). Since the first type of resonators 650 and the second type of resonators 660 are formed on different type of substrate, it is beneficial to implement the first type of resonators 650 and the second type of resonators 660 on different substrates which are formed on different die. Moreover, the second type of resonators 660 of the first filter 610 and the second type of resonators 660 of the second filter 620 may be formed on a same die (b). By sharing the substrate for identical type of resonators, the space can be used more efficiently.

The filter assembly 600 may include a multiplexer that includes the first filter 610 and the second filter 620. It is to be understood that the filter assembly 600 may be duplexer or a triplexer.

Figure 7:
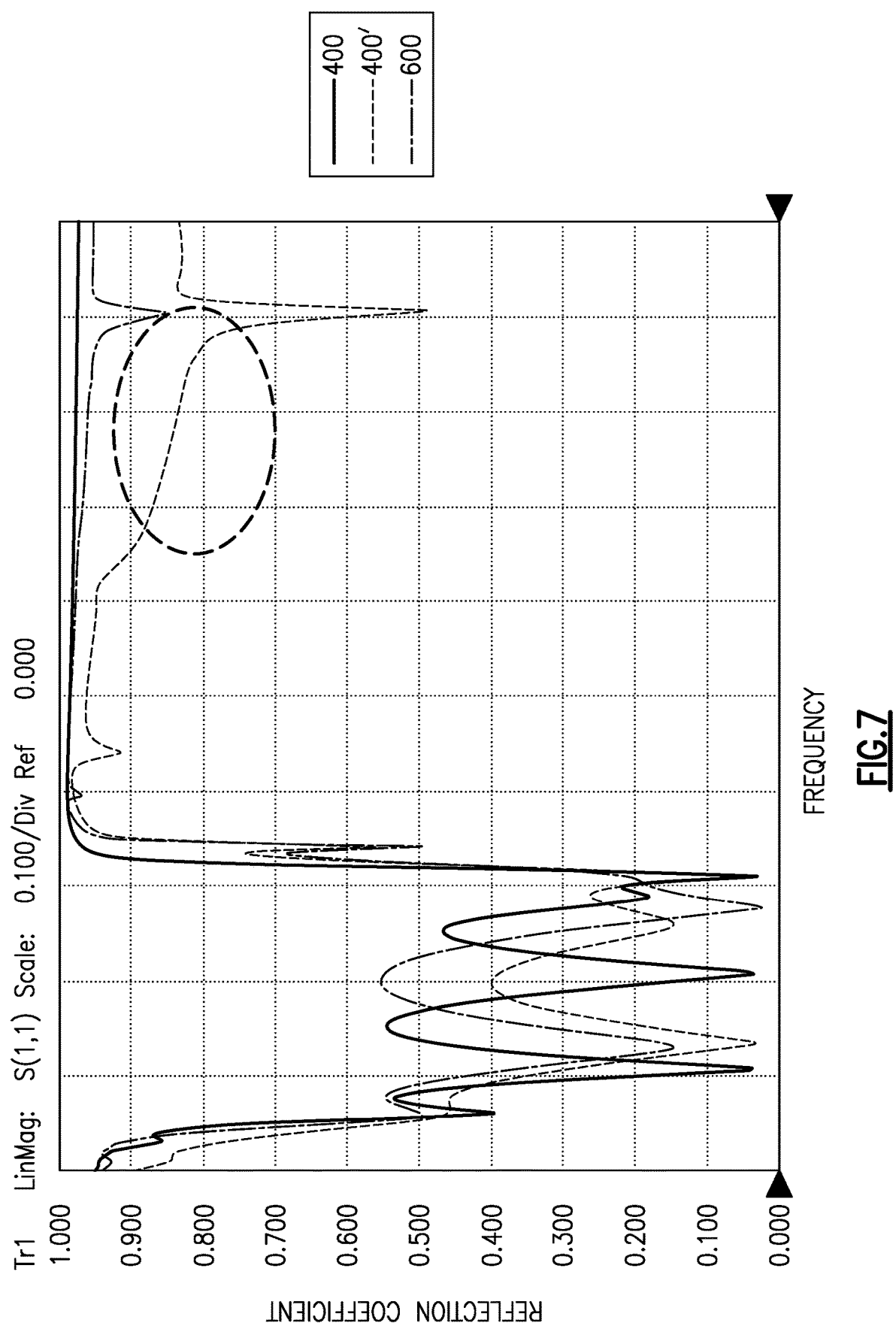
FIG. 7 is an example of reflection coefficient of first filter from the filter assembly illustrated in FIG. 6.

FIG. 7 is an example of the reflection coefficient of first filter from the filter assembly illustrated in FIG. 6. The reflection coefficients of the duplexers 400, 400' are identical to the graph shown in FIG. 5.

As shown in FIG. 7, the filter assembly 600 illustrated in FIG. 6 has an improved reflection coefficient at the stopband of the first band 610, compared to the first filter 410' of duplexer 400' illustrated in FIG. 4B, by concealing the antenna side of the first filter 610 with the second type of resonators 660 having better reflection characteristics.

Figure 8A:
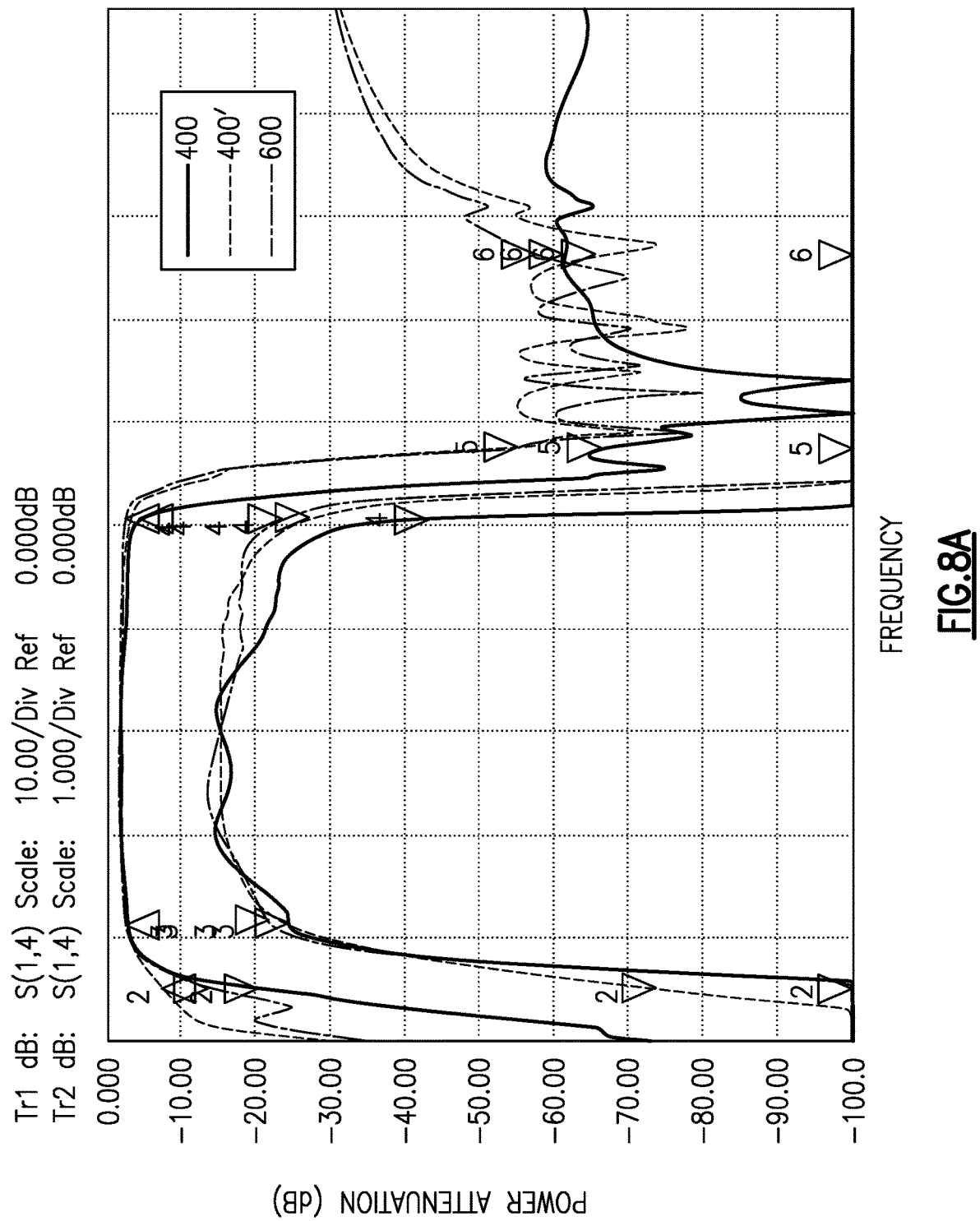
FIG. 8A shows a power attenuation of first filters from each of duplexers and filter assembly according to an embodiment.

FIG. 8A is an example of bandwidth of first filter and second filter from each of duplexers 400, 400' and the filter assembly 600 according to an embodiment.

FIG. 8A shows a power attenuation (dB) of first filters 410, 410', 610 from each of duplexers 400, 400' and filter assembly 600 according to an embodiment. As shown in FIG. 8A, the bandwidth of the first filter 410 of duplexer 400 does not have enough $K^2$ value to cover wider passband. By replacing the first type of resonators for the first filter 410', the passband of the first filter 410' of the duplexer 400' has been enhanced. Furthermore, the bandwidth of the first filter 610 of the filter assembly 600 according to an embodiment also has an improved (wider) passband.

Figure 8B:
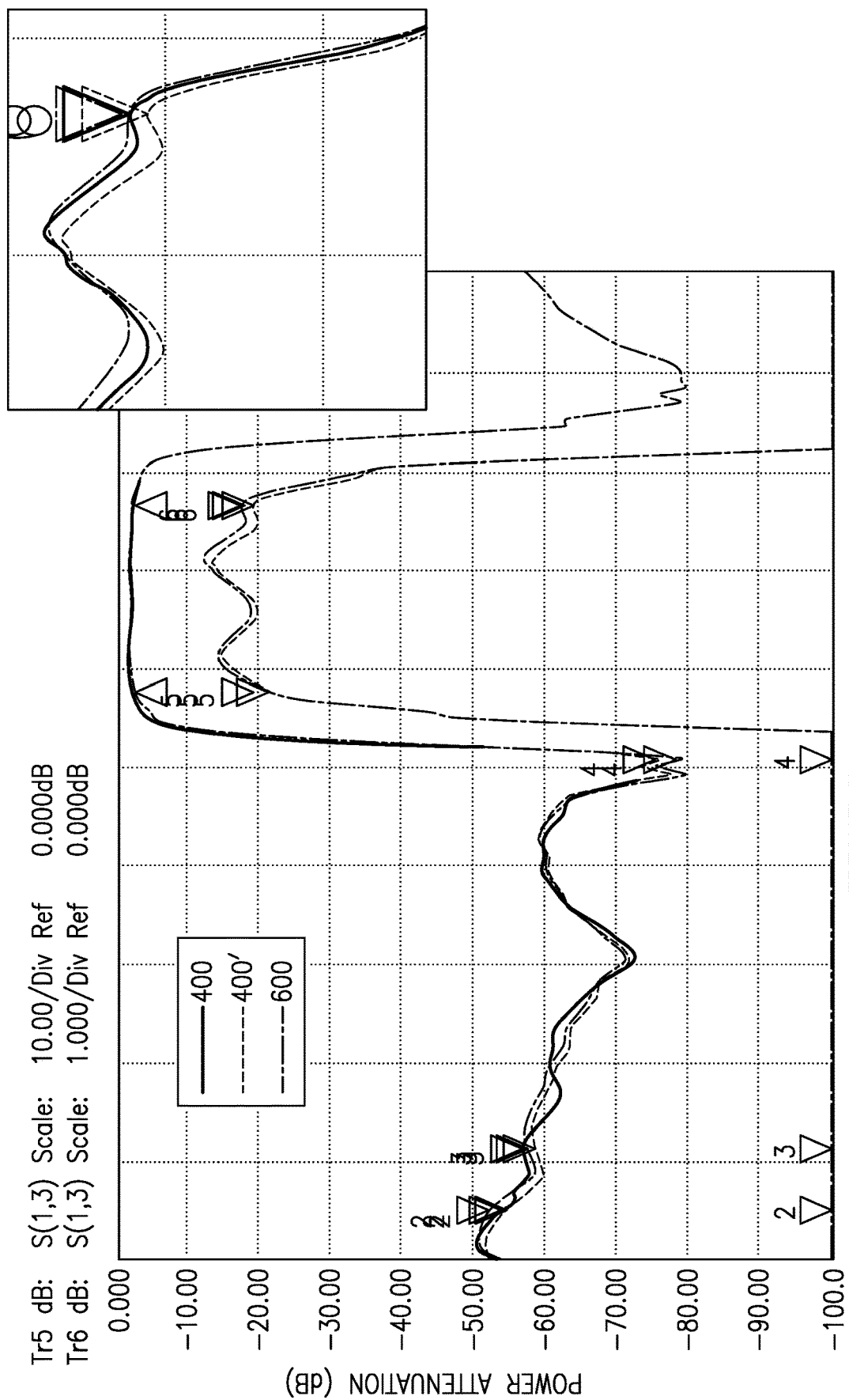
FIG. 8B shows a power attenuation of second filters from each of duplexers and filter assembly according to an embodiment.

FIG. 8B shows a power attenuation (dB) of second filters 420, 420', 620 from each of duplexers 400, 400' and filter assembly 600 according to an embodiment. When the first type of resonators are adopted to the first filter 410' of the duplexer 400', the performance of the second filter 420' of the duplexer 400' is also degraded by loading of the first filter 410' due to the common antenna node. In filter assembly 600 according to an embodiment, by enhancing the reflection characteristic of the first filter 610 of the filter assembly 600, the performance of the second filter 620 of the filter assembly 600 is also improved.

Figure 9B:
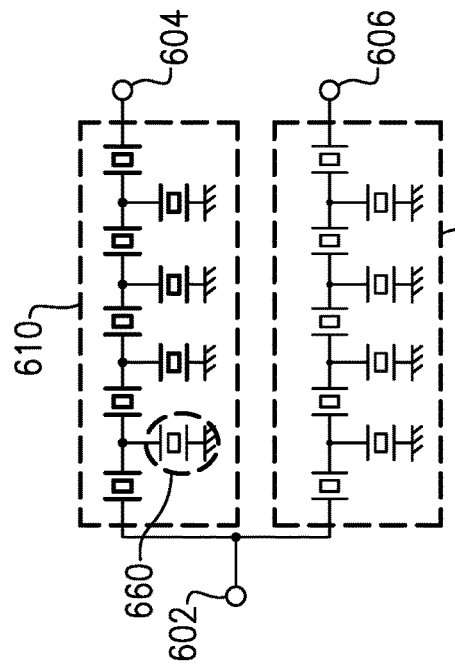
FIGS. 9A-9D are examples of filter assemblies according to embodiments.
Figure 9D:
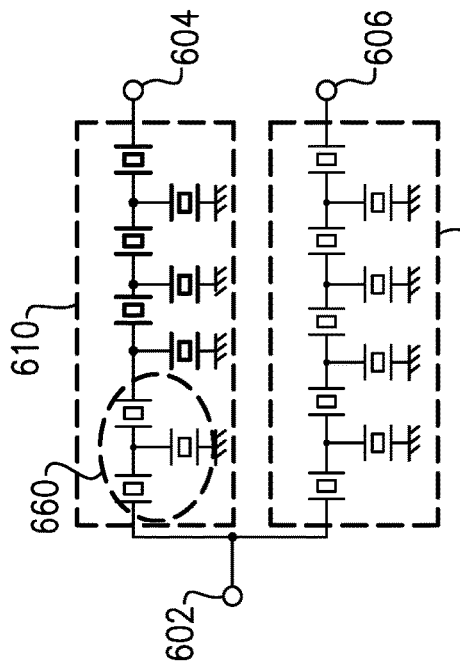
Figure 9A:
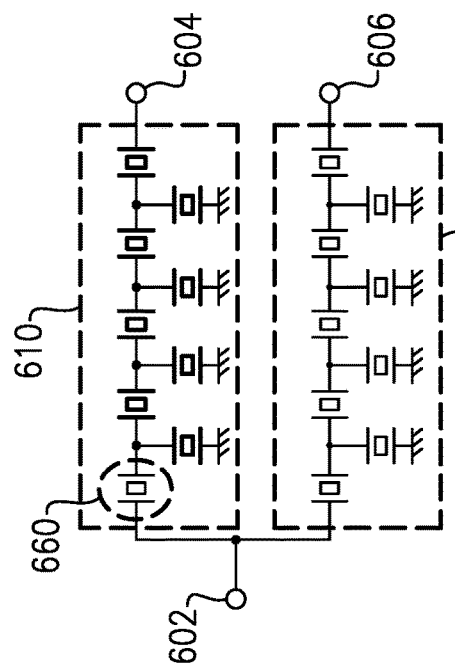
Figure 9C:
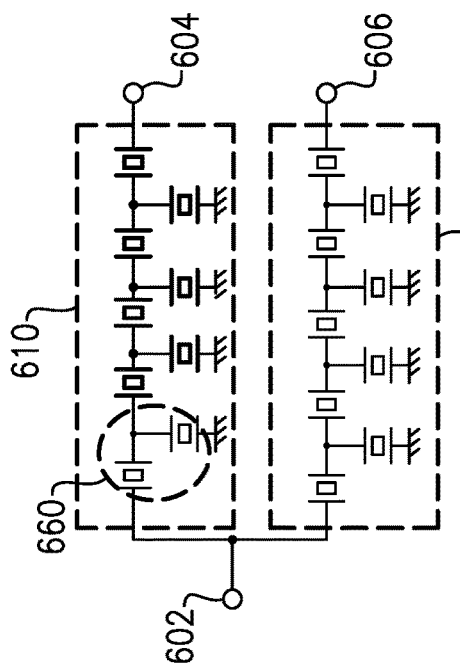

FIGS. 9A-9D are examples of filter assemblies according to different embodiments. In FIG. 9A, the series resonator of the first filter 610 nearest to the antenna node 602 is the second type of resonator 660. In FIG. 9B, the shunt resonator of the first filter nearest to the antenna node 602 is the second type of resonator 660. In FIG. 9C, both the series resonator and the shunt resonator of the first filter 610 nearest to the antenna node 602 are the second type of resonators 660. In FIG. 9D, two series resonators nearest to the antenna node 602 and the shunt resonator nearest to the antenna node 602 are the second type of resonators 660.

Figure 10C:
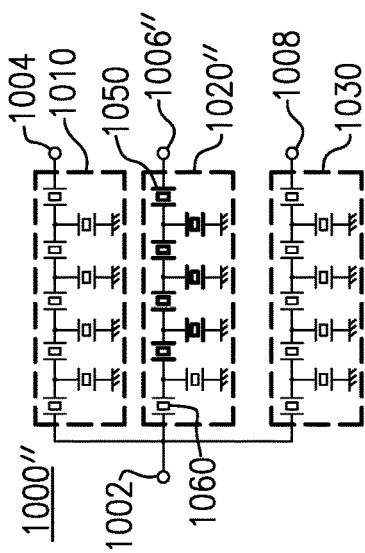
FIG. 10C is an example of structure of a filter assembly according to an embodiment.
Figure 10B:
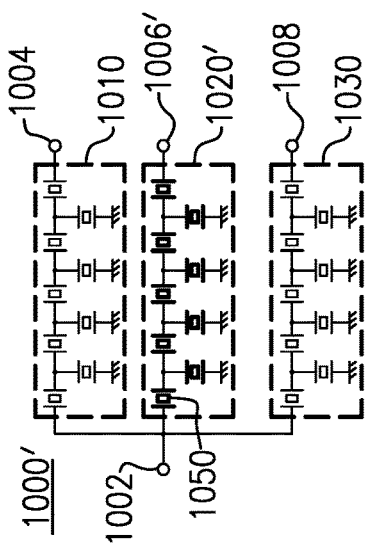
FIG. 10B is an example of structure of a triplexer with an adjusted second filter.
Figure 10A:
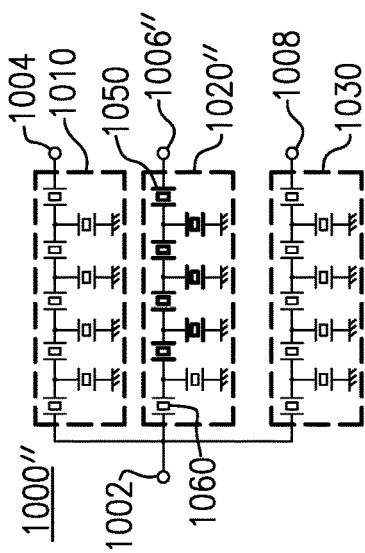
FIG. 10A is an example of structure of a triplexer.

FIGS. 10A-10C show further examples of triplexers 1000, 1000', and a filter assembly 1000" according to an embodiment.

FIG. 10A is an example of structure of a triplexer 1000 including a first filter 1010, a second filter 1020, and a third filter 1030. The first filter 1010 has the lowest passband among the filters 1010, 1020, 1030. The second filter 1020 has mid-range passband, and the third filter 1030 has the highest passband among the filters 1010, 1020, 1030.

Each of the first filter 1010, the second filter 1020, and the third filter 1030 consist of the second type of resonators 1060. The second type of resonators 1060 are formed on a substrate having a range of $-10°<\phi<10°$, $26°<\theta<46°$, $-10°<\psi<10°$ in Euler angle $(\phi, \theta, \psi)$ notation, wherein $\phi$ and $\theta$ are cut angles of the substrate, and $\psi$ is a propagation angle of the substrate.

Apart from the first filter 1010, which is added to operate at a lower frequency band, the triplexer 1000 illustrated in FIG. 10A is identical to the duplexer 400 illustrated in FIG. 4A. As in the duplexer 400 introduced in FIG. 4A, the second filter 1020 (corresponding to the first filter 410 in FIG. 4A) does not have a desired $K^2$ value, and therefore the second filter 1020 is adjusted to improve the bandwidth of passband of the second filter 1020.

FIG. 10B is an example of a structure of a triplexer 1000' with an adjusted second filter 1020'. The triplexer 1000' includes a first filter 1010, a second filter 1020', and a third filter 1030.

The adjusted second filter 1020' includes the first type of resonators 1050. The first type of resonators 1050 are configured to broaden the bandwidth of the first passband, because the substrate on which the first type of resonators 1050 are formed has a high $K^2$ value. The first type of resonators 1050 are formed on a first substrate having a different cut angle from a second substrate on which the second type of resonators 1060 are formed.

More specifically, the first substrate has a range of $80°<\theta<120°$ in Euler angle $(\phi, \theta, \psi)$ notation, and the second substrate has a range of $26°<\theta<46°$ in Euler angle $(\phi, \theta, \psi)$ notation, wherein $\phi$ and $\theta$ are cut angles of each of the first substrate and the second substrate, and v is a propagation angle of each of the first substrate and the second substrate. The first substrate and the second substrate have same ranges of $\phi$ and $\psi$ in the Euler angle $(\phi, \theta, \psi)$ notation. The first type of resonator 1050 may be a resonator configured to detect a shear horizontal wave propagation or a Rayleigh wave propagation.

However, the triplexer 1000' still has a problem of degraded reflection characteristics at the stopband of the second filter 1020'. Therefore, the second filter 1020' may be further adjusted.

FIG. 10C is an example of structure of a filter assembly 1000" according to an embodiment. The filter assembly 1000" includes a first filter 1010, a second filter 1020", and a third filter 1030.

Apart from the first filter 1010 of the triplexer 1000" illustrated in FIG. 10C, which is added to operate at lower frequency band, the structure of triplexer 1000" is identical to the structure of filter assembly 600 illustrated in FIG. 6. In addition, the type of resonators used for the first filter 1010 is identical to that of the third filter 1030 (corresponding to a second filter 620 in FIG. 6). It is to be understood that the structure of filter assembly 600 illustrated in FIG. 6 can be adapted to a triplexer.

The second filter 1020" includes the second type of resonators 1060. More specifically, the second filter 1020" includes the second type of resonators 1060 on the side of the antenna node 1002 to enhance reflection characteristics at the stopband of the second filter 1020". Since the resonators on the side of antenna node 1002 dominantly influence the reflection coefficient of the filter, it is desired to arrange the second type of resonators 1060 on the side of antenna node 1002.

Figure 11A:
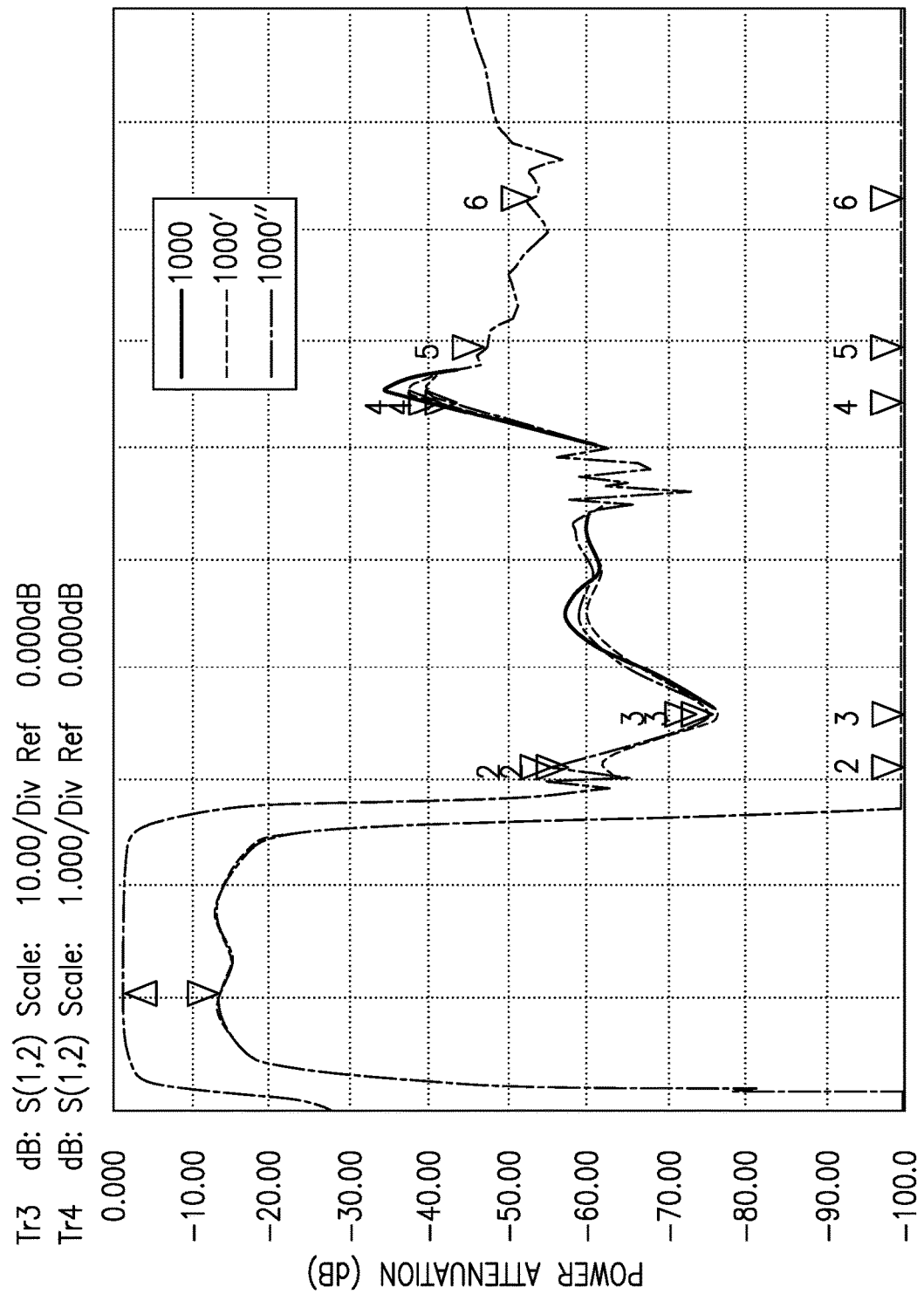
FIG. 11A shows a power attenuation of first filters from each of the triplexers and filter assembly according to an embodiment.

FIG. 11A is an example of bandwidth of first, second, and third filters from each of triplexers 1000, 1000' and the filter assembly 1000" according to an embodiment.

FIG. 11A shows a power attenuation (dB) of first filters 1010 from each of the triplexers 1000, 1000' and filter assembly 1000" according to an embodiment. As shown in FIG. 11A, when the first type of resonators are adopted to the second filter 1020'. 1020", the performance of first filter 1010 is also degraded by loading of the second filter 1020', 1020" due to common antenna node. According to an embodiment, by enhancing the reflection characteristic of the second filter 1020" of the filter assembly 1000", the performance of the first filter 1010 of the filter assembly 1000" is also improved.

Figure 11B:
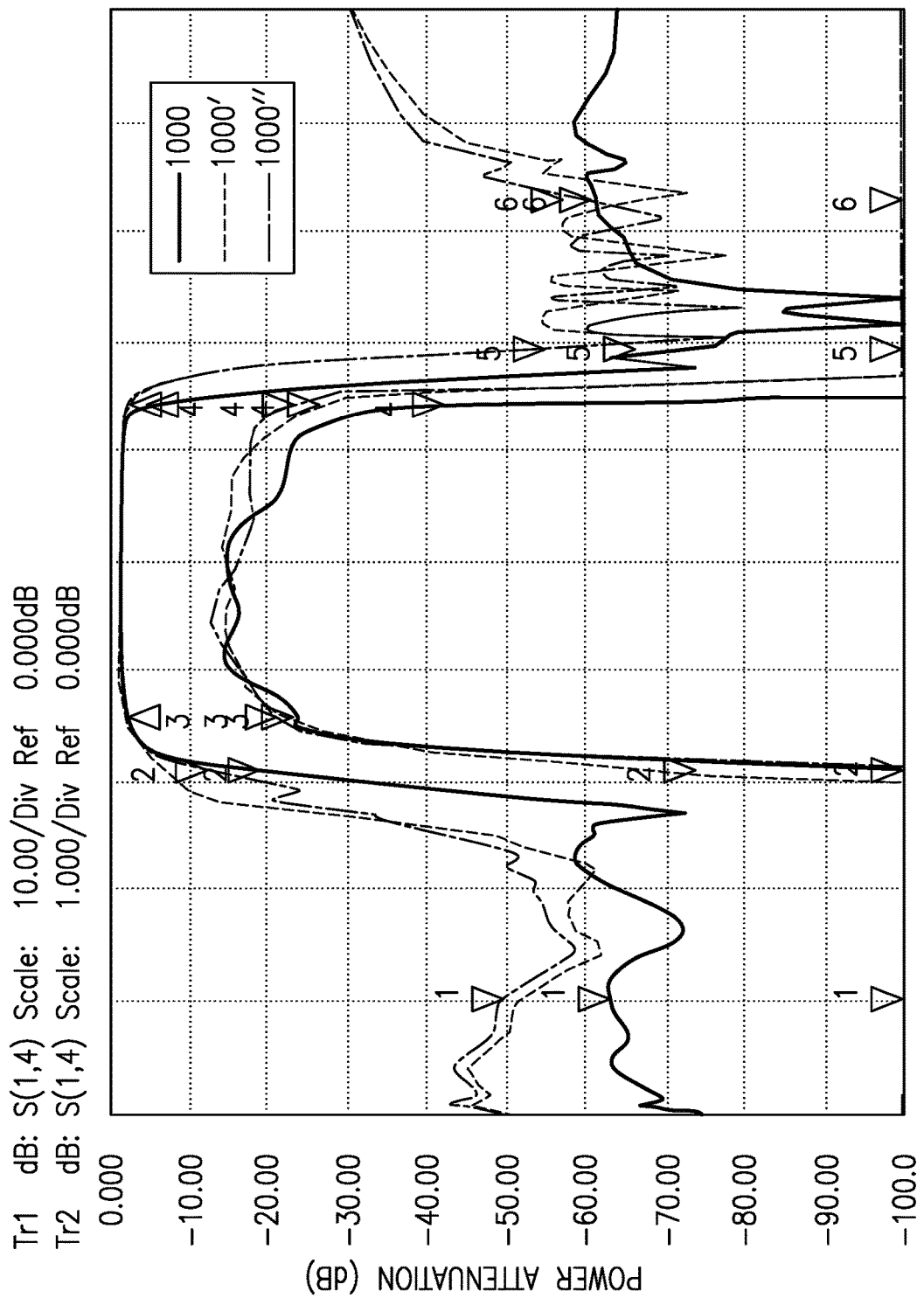
FIG. 11B shows a power attenuation of second filters from each of the triplexers and filter assembly according to an embodiment.

FIG. 11B shows a power attenuation (dB) of second filters 1020, 1020', 1020" from each of the triplexers 1000, 1000' and filter assembly 1000" according to an embodiment. The bandwidth of the second filter 1020 of triplexer 1000 does not have a high enough $K^2$ value to cover the wider passband. By replacing with the first type of resonators for the second filter 1020', the passband of the second filter 1020' of the triplexer 1000' has been broadened. Furthermore, the bandwidth of the second filter 1020" of the filter assembly 1000" according to an embodiment also has an improved (wider) passband.

Figure 11C:
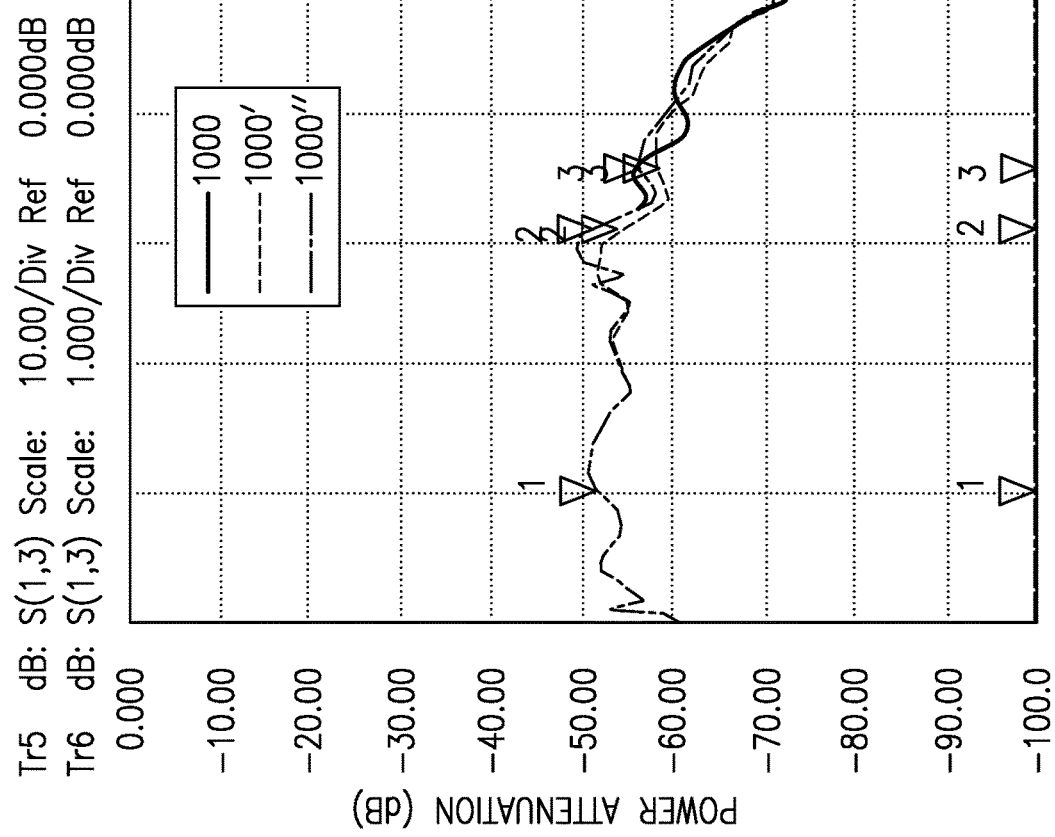
FIG. 11C shows a power attenuation of third filters from each of the triplexers and filter assembly according to an embodiment.

FIG. 11C shows a power attenuation (dB) of third filters 1030 from each of the triplexers 1000, 1000' and filter assembly 1000" according to an embodiment. As shown in FIG. 11C, when the first type of resonators are adopted to the second filter 1020', 1020", the performance of third filter 1030' is also degraded by loading of the second filter 1020', 1020" due to the common antenna node. According to an embodiment, by enhancing the reflection characteristic of the second filter 1020" of the filter assembly 1000", the performance of the third filter 1030 of the filter assembly 1000" is also improved.

Figure 12:
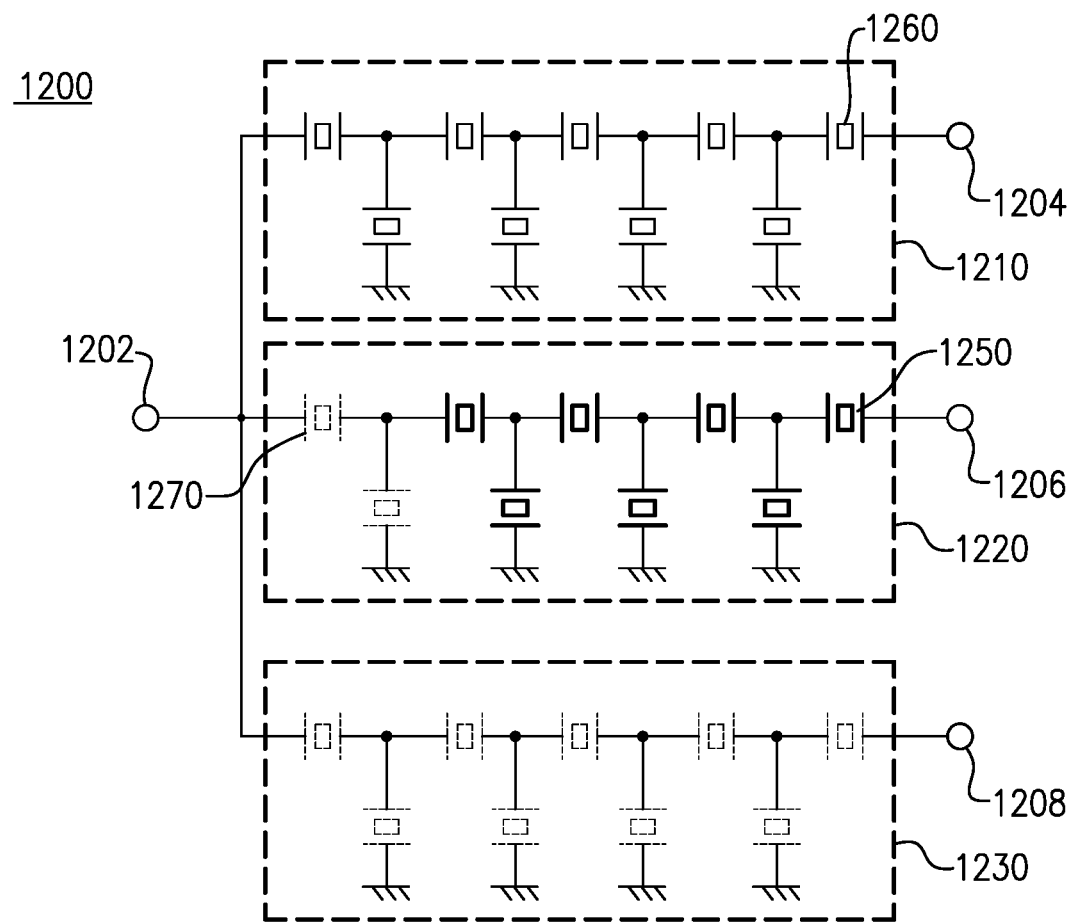
FIG. 12 is another example of the structure of triplexer according to an embodiment.

FIG. 12 is another example of the structure of triplexer 1200 according to an embodiment. In FIG. 12, a triplexer 1200 including a first filter 1210, a second filter 1220, and a third filter 1230 is illustrated. The radio frequency signal that is input to the first filter 1210, second filter 1220, or third filter 1230 through an antenna node 1202 is output through the output nodes 1204, 1206, 1208, respectively.

The first filter 1210 consists of the second type of resonators 1260. The second filter 1220 includes the first type of resonators 1250. The first type of resonator 1250 is configured to broaden bandwidth of passband of the second filter 1220. The second filter 1220 includes a third type of resonators 1270 on a side of antenna node 1202. The third type of resonators may be a BAW resonator. A BAW resonator is an electromechanical device in which a standing acoustic wave is generated by an electrical signal in the bulk of a piezoelectric material. In the simplest configuration, BAW resonator will include a piezoelectric material (typically quartz, AlN, or ZnO) sandwiched between two metallic electrodes. According to an embodiment, the third type resonator 1270 is configured to enhance reflection characteristics of the second filter 1220.

According to an embodiment, at least a series resonator nearest to the antenna node 1202 or a shunt resonator nearest to the antenna node 1202 among the plurality of resonators of the second filter 1220 is the third type of resonator 1270. According to an example, the series resonator of the second filter 1220 nearest to the antenna node 1202 may be the third type of resonator 1270. Alternatively, the shunt resonator of the second filter 1220 nearest to the antenna node 1202 may be the third type of resonator 1270. According to another example, both the series resonator and the shunt resonator of the second filter 1220 nearest to the antenna node 1202 may be the third type of resonators 1270. According to another example, two series resonators nearest to the antenna node 1202 and the shunt resonator nearest to the antenna node 1202 may be the third type of resonators 1270. However, it is understood that the number of third type of resonators 1270 used for the second filter 1220 is not limited thereto.

The third filter 1230 consists of the third type of resonators 1270. The first filter 1210, the second filter 1220, and the third filter 1230 operate in a lower frequency band, a mid-range frequency band, and a higher frequency band, respectively.

Figure 13A:
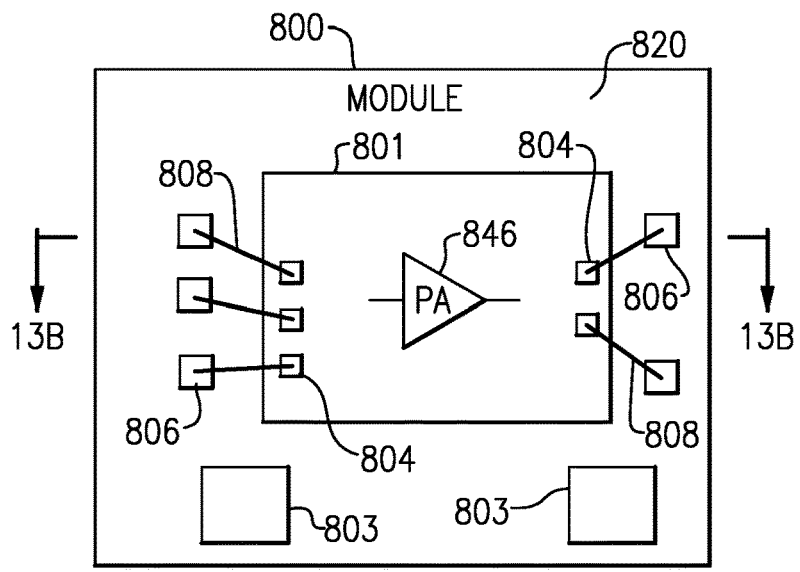
FIG. 13A is a schematic diagram of one embodiment of a packaged module.
Figure 13B:
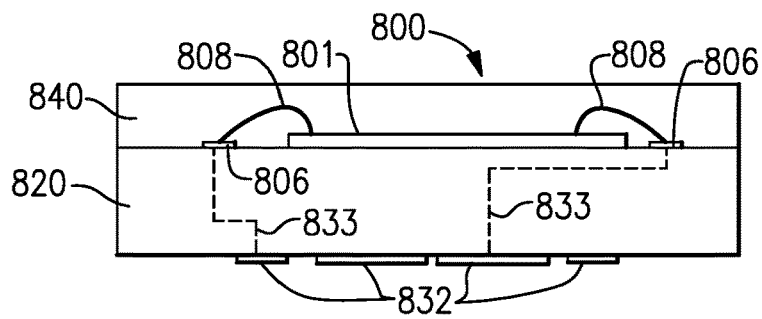
FIG. 13B is a schematic diagram of a cross-section of the packaged module of FIG. 13A taken along the lines 13B-13B.

FIG. 13A is a schematic diagram of one embodiment of a packaged module 800. FIG. 13B is a schematic diagram of a cross-section of the packaged module 800 of FIG. 13A taken along the lines 13A-13B.

The packaged module 800 includes an IC or die 801, surface mount components 803, wirebonds 808, a package substrate 820, and encapsulation structure 840. The package substrate 820 includes pads 806 formed from conductors disposed therein. Additionally, the die 801 includes pads 804, and the wirebonds 808 have been used to electrically connect the pads 804 of the die 801 to the pads 806 of the package substrate 820.

The die 801 includes a filter module, which can be implemented in accordance with any of the embodiments herein.

The packaging substrate 820 can be configured to receive a plurality of components such as the die 801 and the surface mount components 803, which can include, for example, surface mount capacitors and/or inductors.

As shown in FIG. 13B, the packaged module 800 is shown to include a plurality of contact pads 832 disposed on the side of the packaged module 800 opposite the side used to mount the die 801. Configuring the packaged module 800 in this manner can aid in connecting the packaged module 800 to a circuit board such as a phone board of a wireless device. The example contact pads 832 can be configured to provide RF signals, bias signals, power low voltage(s) and/or power high voltage(s) to the die 801 and/or the surface mount components 803. As shown in FIG. 13B, the electrically connections between the contact pads 832 and the die 801 can be facilitated by connections 833 through the package substrate 820. The connections 833 can represent electrical paths formed through the package substrate 820, such as connections associated with vias and conductors of a multilayer laminated package substrate.

In some embodiments, the packaged module 800 can also include one or more packaging structures to, for example, provide protection and/or facilitate handling of the packaged module 800. Such a packaging structure can include overmold or encapsulation structure 840 formed over the packaging substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 14:
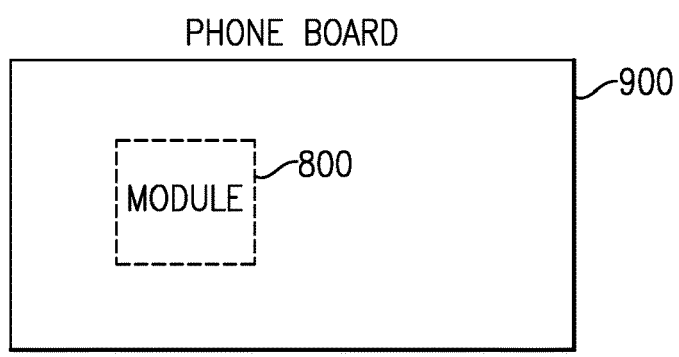
FIG. 14 is a schematic diagram of one embodiment of a phone board.

FIG. 14 is a schematic diagram of one embodiment of a phone board 900. The phone board 900 includes the module 800 shown in FIGS. 13A-13B attached thereto. Although not illustrated in FIG. 14 for clarity, the phone board 800 can include additional components and structures.

Some of the embodiments described above have provided examples in connection with wireless devices or mobile phones. However, the principles and advantages of the embodiments can be used for any other systems or apparatus that have needs for power amplifiers.

Such envelope trackers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise." "comprising." and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above." "below," and words of similar import, when used in this disclosure, shall refer to this disclosure as a whole and not to any particular portions of this disclosure. Where the context permits, words in the above Detailed Description using the singular or plural number may also include the plural or singular number respectively. The word "or" in reference to a list of two or more items covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings provided herein can be applied to other systems, not necessarily the system described above. The elements and acts of the various embodiments described above can be combined to provide further embodiments.

While certain embodiments have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A filter assembly comprising:
a first filter configured to allow signals received via an antenna node to pass at a first passband, the first filter including a plurality of resonators connected in series and parallel arms, the plurality of resonators of the first filter including a first type of resonator configured to broaden the first passband, at least a series resonator nearest to the antenna node or a shunt resonator nearest to the antenna node among the plurality of resonators of the first filter being a second type of resonator configured to improve reflection characteristics at a stopband of the first filter; and
a second filter configured to allow the signals received via the antenna node to pass at a second passband using the second type of resonators, the first type of resonators being formed on a first substrate having a different cut angle from a second substrate on which the second type of resonators are formed, the first substrate having a range of $80°<\theta<120°$ in Euler angle $(\phi, \theta, \psi)$ notation, and the second substrate having a range of $26°<\theta<46°$ in Euler angle $(\phi, \theta, \psi)$ notation, $\phi$ and $\theta$ being cut angles of each of the first substrate and the second substrate, and $\psi$ being a propagation angle of each of the first substrate and the second substrate.

2. The filter assembly of claim 1 wherein the first passband has lower frequency range than the second passband.

3. The filter assembly of claim 1 wherein each of the first filter and the second filter is a ladder-type surface acoustic wave filter.

4. The filter assembly of claim 1 wherein the first substrate and the second substrate have same ranges of $\phi$ and $\psi$ in the Euler angle $(\phi, \theta, \psi)$ notation.

5. The filter assembly of claim 1 wherein the first type of resonators are resonators configured to detect one of a shear horizontal (SH) wave propagation or a Rayleigh wave propagation.

6. The filter assembly of claim 1 wherein the second type of resonators of the first filter are formed on the second substrate together with the second type of resonators of the second filter in a single die.

7. The filter assembly of claim 1 wherein the filter assembly includes a multiplexer that includes the first filter and the second filter.

8. A radio frequency module comprising:
a packaging board configured to receive a plurality of components;
a filter assembly implemented on the packaging board, the filter assembly including a first filter configured to allow signals received through an antenna node to pass at a first passband, the first filter including a plurality of resonators connected in series and parallel arms, the plurality of resonators of the first filter including a first type of resonator that is formed on a first substrate to broaden the first passband, at least a series resonator nearest to the antenna node or a shunt resonator nearest to the antenna node among the plurality of resonators of the first filter being a second type of resonator that is formed on a second substrate to improve reflection characteristics at a stopband of the first filter, the first substrate having a range of $80°<\theta<120°$ in Euler angle $(\phi, \theta, \psi)$ notation, and the second substrate having a range of $26°<\theta<46°$ in the Euler angle $(\phi, \theta, \psi)$ notation, $\phi$ and $\theta$ being cut angles of each of the first substrate and the second substrate, and $\psi$ being a propagation angle of each of the first substrate and the second substrate; and
a second filter configured to allow the signals received via the antenna node to pass at a second passband using the second type of resonators.

9. The radio frequency module of claim 8 wherein the radio frequency module is a front-end module.

10. The radio frequency module of claim 8 wherein each of the first filter and the second filter is a ladder-type surface acoustic wave filter.

11. The radio frequency module of claim 8 wherein the first substrate and the second substrate have same ranges of $\phi$ and $\psi$ in the Euler angle $(\phi, \theta, \psi)$ notation.

12. The radio frequency module of claim 8 wherein the first type of resonators are resonators configured to detect one of a shear horizontal (SH) wave propagation or a Rayleigh wave propagation.

13. The radio frequency module of claim 8 wherein the second type of resonators of the first filter are formed on the second substrate together with the second type of resonators of the second filter in a single die.

14. The radio frequency module of claim 8 wherein the filter assembly includes a multiplexer that includes the first filter and the second filter.

15. A mobile device comprising:
an antenna configured to receive a radio frequency signal; and
a front end system configured to communicate with the antenna, the front end system including a filter assembly having a first filter configured to allow signals received through an antenna node to pass at a first passband, the first filter including a plurality of resonators connected in series and parallel arms, the plurality of resonators of the first filter including a first type of resonator that is formed on a first substrate to broaden the first passband, at least a series resonator nearest to the antenna node or a shunt resonator nearest to the antenna node among the plurality of resonators of the first filter being a second type of resonator that is formed on a second substrate such to improve reflection characteristics at a stopband of the first filter, and a second filter configured to allow the signals received via the antenna node to pass at a second passband using a plurality of the second type of resonator, the first substrate having a range of $80°<\theta<120°$ in Euler angle $(\phi, \theta, \psi)$ notation, and the second substrate having a range of $26°<\theta<46°$ in the Euler angle $(\phi, \theta, \psi)$ notation, $\phi$ and $\theta$ being cut angles of each of the first substrate and the second substrate, and w being a propagation angle of each of the first substrate and the second substrate.

16. The mobile device of claim 15 wherein each of the first substrate and the second substrate is a piezoelectric substrate formed of lithium niobate ($LiNbO_3$).

\* \* \* \* \*

UNITED STATES PATENT AND TRADEMARK OFFICE
CERTIFICATE OF CORRECTION

| | | |
|---|---|---|
| PATENT NO. | : 12,300,912 B2 | Page 1 of 1 |
| APPLICATION NO. | : 18/157202 | |
| DATED | : May 13, 2025 | |
| INVENTOR(S) | : Joji Fujiwara et al. | |

It is certified that error appears in the above-identified patent and that said Letters Patent is hereby corrected as shown below:

In the Specification

Column 5, Line 27, delete "(PAS)" and insert -- (PAs) --
Column 7, Line 32, delete "1 GHZ" and insert -- 1 GHz --
Column 7, Line 35, delete "2.2 GHZ" and insert -- 2.2 GHz --
Column 13, Line 47, delete "v" and insert -- ψ --

In the Claims

Column 19, Line 17, Claim 15, delete "w" and insert -- ψ --

Signed and Sealed this
Tenth Day of June, 2025

Coke Morgan Stewart
*Acting Director of the United States Patent and Trademark Office*